US012713899B2

(12) United States Patent
Wang et al.

(10) Patent No.: US 12,713,899 B2
(45) Date of Patent: Aug. 18, 2026

(54) SEMICONDUCTOR DEVICE AND FABRICATION METHOD THEREOF

(71) Applicant: Yangtze Memory Technologies Co., Ltd., Wuhan (CN)

(72) Inventors: Renyan Wang, Wuhan (CN); Wei Xu, Wuhan (CN); Zhipeng Wu, Wuhan (CN); Hang Yin, Wuhan (CN); Chao Sun, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 371 days.

(21) Appl. No.: 18/442,962

(22) Filed: Feb. 15, 2024

(65) Prior Publication Data

US 2025/0233067 A1 Jul. 17, 2025

(30) Foreign Application Priority Data

Jan. 15, 2024 (CN) ......................... 202410057165.6

(51) Int. Cl.

| | |
|---|---|
| ***H10W 20/43*** | (2026.01) |
| ***H10B 12/00*** | (2023.01) |
| ***H10B 41/20*** | (2023.01) |
| ***H10B 41/35*** | (2023.01) |
| ***H10B 43/20*** | (2023.01) |
| ***H10B 43/35*** | (2023.01) |
| ***H10D 84/85*** | (2025.01) |

(52) U.S. Cl.

CPC .......... *H10W 20/43* (2026.01); *H10B 12/482* (2023.02); *H10B 12/485* (2023.02); *H10B 12/488* (2023.02); *H10B 41/20* (2023.02); *H10B 41/35* (2023.02); *H10B 43/20* (2023.02); *H10B 43/35* (2023.02); *H10D 84/85* (2025.01)

(58) Field of Classification Search

None

See application file for complete search history.

(56) References Cited

U.S. PATENT DOCUMENTS

| | | | | |
|---|---|---|---|---|
| 2011/0031546 A1* | 2/2011 | Uenaka | H10B 43/20 438/479 |
| 2011/0169071 A1* | 7/2011 | Uenaka | H10B 43/20 257/326 |
| 2016/0020169 A1* | 1/2016 | Matsuda | H10B 41/50 438/622 |
| 2019/0096810 A1* | 3/2019 | Zhu | H10B 41/41 |

* cited by examiner

*Primary Examiner* — Bilkis Jahan

(74) *Attorney, Agent, or Firm* — Fish & Richardson P.C.

(57) ABSTRACT

The present disclosure relates to semiconductor devices and fabrication methods thereof. An example semiconductor device includes conductive layers. The conductive layers include a first conductive layer and a second conductive layer. The semiconductor device further includes an insulating structure over the first conductive layer and the second conductive layer. The insulating structure includes a first layer. A material of the first layer has a first etching rate smaller than an etching rate of an insulating material between the conductive layers. The semiconductor device further includes a first contact structure extending through a first portion of the first layer and connected to the first conductive layer. The semiconductor device further includes a second contact structure extending through a second portion of the first layer and connected to the second conductive layer.

20 Claims, 14 Drawing Sheets

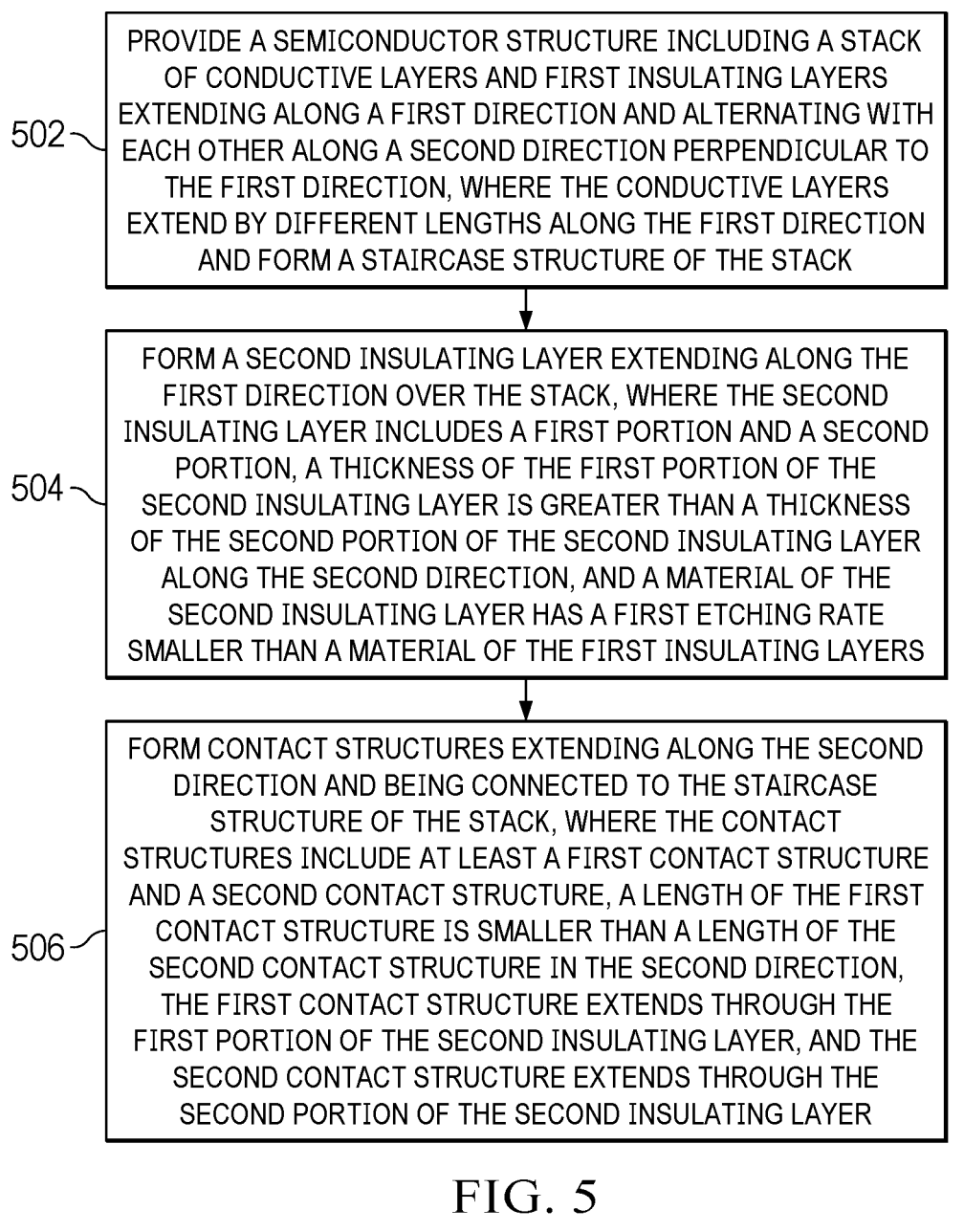

502 PROVIDE A SEMICONDUCTOR STRUCTURE INCLUDING A STACK OF CONDUCTIVE LAYERS AND FIRST INSULATING LAYERS EXTENDING ALONG A FIRST DIRECTION AND ALTERNATING WITH EACH OTHER ALONG A SECOND DIRECTION PERPENDICULAR TO THE FIRST DIRECTION, WHERE THE CONDUCTIVE LAYERS EXTEND BY DIFFERENT LENGTHS ALONG THE FIRST DIRECTION AND FORM A STAIRCASE STRUCTURE OF THE STACK

504 FORM A SECOND INSULATING LAYER EXTENDING ALONG THE FIRST DIRECTION OVER THE STACK, WHERE THE SECOND INSULATING LAYER INCLUDES A FIRST PORTION AND A SECOND PORTION, A THICKNESS OF THE FIRST PORTION OF THE SECOND INSULATING LAYER IS GREATER THAN A THICKNESS OF THE SECOND PORTION OF THE SECOND INSULATING LAYER ALONG THE SECOND DIRECTION, AND A MATERIAL OF THE SECOND INSULATING LAYER HAS A FIRST ETCHING RATE SMALLER THAN A MATERIAL OF THE FIRST INSULATING LAYERS

506 FORM CONTACT STRUCTURES EXTENDING ALONG THE SECOND DIRECTION AND BEING CONNECTED TO THE STAIRCASE STRUCTURE OF THE STACK, WHERE THE CONTACT STRUCTURES INCLUDE AT LEAST A FIRST CONTACT STRUCTURE AND A SECOND CONTACT STRUCTURE, A LENGTH OF THE FIRST CONTACT STRUCTURE IS SMALLER THAN A LENGTH OF THE SECOND CONTACT STRUCTURE IN THE SECOND DIRECTION, THE FIRST CONTACT STRUCTURE EXTENDS THROUGH THE FIRST PORTION OF THE SECOND INSULATING LAYER, AND THE SECOND CONTACT STRUCTURE EXTENDS THROUGH THE SECOND PORTION OF THE SECOND INSULATING LAYER

FIG. 5

SEMICONDUCTOR DEVICE AND FABRICATION METHOD THEREOF

CROSS-REFERENCE TO RELATED APPLICATIONS

This application claims priority to Chinese Patent Application No. 202410057165.6, filed on Jan. 15, 2024, which is hereby incorporated by reference in its entirety.

TECHNICAL FIELD

The present disclosure relates to semiconductor devices and fabrication methods thereof.

BACKGROUND

Semiconductor devices, e.g., memory devices, can have various structures to increase a density of memory cells and lines on a chip. For example, three-dimensional (3D) memory devices are attractive due to their capability to increase an array density by stacking more layers within a similar footprint. A 3D memory device normally includes a memory array of memory cells and peripheral circuits for facilitating operations of the memory array.

SUMMARY

The present disclosure describes methods, devices, systems, and techniques related to contact structures in semiconductor devices, e.g., 3D memory devices.

One aspect of the present disclosure features a semiconductor device including conductive layers, an insulating structure, a first contact structure, and a second contact structure. The conductive layers include a first conductive layer and a second conductive layer. The insulating structure extends along a first direction over the first conductive layer and the second conductive layer. The insulating structure includes a first layer extending along the first direction. A material of the first layer has a first etching rate smaller than an etching rate of an insulating material between the conductive layers. The first contact structure extends through a first portion of the first layer and connected to the first conductive layer. The second contact structure extends through a second portion of the first layer and connected to the second conductive layer. The first contact structure and the second contact structure extend along a second direction perpendicular to the first direction. A length of the first contact structure is smaller than a length of the second contact structure in the second direction. A thickness of the first portion of the first layer is different from a thickness of the second portion of the first layer along the second direction.

In some implementations, the thickness of the first portion of the first layer is greater than the thickness of the second portion of the first layer.

In some implementations, the first conductive layer and the second conductive layer extend by different lengths along the first direction and form a staircase structure.

In some implementations, the first layer has a stepped shape or a slope shape.

In some implementations, the insulating structure further includes a second layer including the insulating material, and the first contact structure and the second contact structure extend through the first layer and the second layer.

In some implementations, the semiconductor device further includes a third conductive layer over the first conductive layer and the second conductive layer and a third contact structure extending through the second layer and connected to the third conductive layer, where a length of the third contact structure is greater than the length of the second contact structure.

In some implementations, the semiconductor device includes a first deck and a second deck stacked along the second direction, the first deck includes the first conductive layer, and the second deck includes the second conductive layer.

In some implementations, each of the first deck and the second deck includes alternative conductive layers and insulating layers along the second direction.

In some implementations, the semiconductor device further includes a third contact structure connected to a third conductive layer comprised in the first deck. A length of the third contact structure is different from the length of the first contact structure. The first contact structure and the third contact structure extend through the first portion of the first layer.

In some implementations, the semiconductor device further includes a fourth contact structure connected to a fourth conductive layer comprised in the first deck. A length of the fourth contact structure is different from the length of the second contact structure. The second contact structure and the fourth contact structure extend through the second portion of the first layer.

In some implementations, the semiconductor device includes a plurality of contact structures extending through the first portion of the first layer along the second direction. Each of the plurality of contact structures has a respective length along the second direction and is connected to a respective conductive layer of conductive layers comprised in the first deck. A number of the conductive layers comprised in the first deck is on an order of hundreds.

In some implementations, the insulating structure further includes a third layer extending along the first direction. The third layer is between the first layer and the first conductive layer. A material of the third layer has a second etching rate smaller than the material of the first layer.

In some implementations, each of the first conductive layer and the second conductive layer has an edge portion thinner than an inner portion along the second direction.

In some implementations, the first contact structure has a different cross section area than the second contact structure at a same position along the second direction.

In some implementations, the semiconductor device includes a 3D NAND memory device including an array wafer. The array wafer includes an array region and a connection region. The semiconductor device includes multiple conductive layers extending through both the array region and the connection region. The multiple conductive layers include the first conductive layer and the second conductive layer. The first contact structure and the second contact structure extend through the connection region. The array region includes channel structures. The channel structures and the multiple conductive layers form at least one memory cell array of the 3D NAND memory device.

In some implementations, the semiconductor device includes a complementary metal-oxide-semiconductor (CMOS) wafer. The CMOS wafer includes peripheral circuits of the at least one memory cell array. The array wafer and the CMOS wafer are bonded together through a bonding interface.

In some implementations, the semiconductor device includes a 3D dynamic random-access memory (DRAM), and the first conductive layer and the second conductive layer include word lines of the 3D DRAM or bit lines of the 3D DRAM.

Another aspect of the present disclosure features a DRAM. The DRAM includes an array of DRAM memory cells, conductive layers, an insulating structure, a first contact structure, and a second contact structure. The conductive layers include a first conductive layer and a second conductive layer coupled to the array of DRAM memory cells. The insulating structure extends along a first direction over the first conductive layer and the second conductive layer. The insulating structure includes a first layer extending along the first direction. A material of the first layer has a first etching rate smaller than an insulating material between the conductive layers. The first contact structure extends through a first portion of the first layer and is connected to the first conductive layer. The second contact structure extends through a second portion of the first layer and is connected to the second conductive layer. The first contact structure and the second contact structure extend along a second direction perpendicular to the first direction. A length of the first contact structure is greater than a length of the second contact structure in the second direction. A thickness of the first portion of the first layer is different from a thickness of the second portion of the first layer along the second direction. The first conductive layer is connected to at least a first semiconductor pillar extending along a third direction perpendicular to the first direction and the second direction. The second conductive layer is connected to at least a second semiconductor pillar extending along the third direction.

In some implementations, the first conductive layer and the second conductive layer are word lines of the DRAM.

In some implementations, the first conductive layer and the second conductive layer are bit lines of the DRAM.

A further aspect of the present disclosure features a method of fabricating a semiconductor device including providing a semiconductor structure. The semiconductor structure includes a stack of conductive layers and first insulating layers extending along a first direction and alternating with each other along a second direction perpendicular to the first direction. The conductive layers extend by different lengths along the first direction and form a staircase structure of the stack. The method further includes forming a second insulating layer extending along the first direction over the stack. The second insulating layer includes a first portion and a second portion. A thickness of the first portion of the second insulating layer is greater than a thickness of the second portion of the second insulating layer along the second direction. A material of the second insulating layer has a first etching rate smaller than a material of the first insulating layers. The method further includes forming contact structures extending along the second direction and being connected to the staircase structure of the stack. The contact structures include at least a first contact structure and a second contact structure. A length of the first contact structure is smaller than a length of the second contact structure in the second direction. The first contact structure extends through the first portion of the second insulating layer. The second contact structure extends through the second portion of the second insulating layer.

In some implementations, forming the contact structures includes forming contact holes extending along the second direction.

In some implementations, forming the contact structures further includes depositing a bonding material on an inner surface of each of the contact holes and depositing a conductive material into each of the contact holes.

In some implementations, forming a second insulating layer includes trimming and etching a portion of the second insulating layer into a stepped shape.

In some implementations, the method further includes depositing a third insulating layer on top of the second insulating layer. The third insulating layer includes a material having a second etching rate greater than the material of the second insulating layer. The contact holes extend through the third insulating layer.

In some implementations, the method further includes forming channel holes in an array region of the semiconductor structure, where the channel holes extend through the conductive layers. The method further includes depositing a memory film in each of the channel holes to form channel structures, where the channel structures and the conductive layers form at least one memory cell array.

Implementations of the present disclosure can provide one or more of the following technical advantages and/or benefits. A 3D memory device can include multiple decks, and each deck can include multiple conductive layers (e.g., word lines or bit lines of the 3D memory device) coupled to contact structures. As the number of decks and conductive layers in the 3D memory device increases, there are growing challenges for forming the contact structures, which can include an etching process followed by deposition of a conductive material. The techniques provided in the present disclosure enable forming the contact structures for the multiple decks in one step, rather than in multiple steps (each step for one of the multiple decks). The techniques also use an insulation structure to control the etching process so that consistent recesses are created in the conductive layers at various depths. As such, without the need to build complicated landing structures in the conductive layers, the techniques can prevent the contact structures from extending through corresponding conductive layers, thereby improving the reliability and performance of the 3D memory device and reducing manufacturing efforts and costs.

The techniques can be applied to various types of semiconductor devices, volatile memory devices, such as DRAM memory devices, or non-volatile memory (NVM) devices, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory devices, e.g., silicon-oxide-nitride-oxide-silicon (SONOS) memory devices, and floating-gate based memory devices. The techniques can be applied to three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

The details of one or more implementations of the subject matter of this present disclosure are set forth in the accompanying drawings and the description below. Other features, aspects, and advantages of the subject matter will become apparent from the description, the drawings, and the claims.

BRIEF DESCRIPTION OF THE DRAWINGS

The accompanying drawings, which are incorporated herein and form a part of the present disclosure, illustrate aspects of the present disclosure and, together with the description, further serve to explain the principles of the present disclosure and to enable a person of ordinary skill in the pertinent art to make and use the present disclosure.

FIG. 5 illustrates a flow chart of an example process for forming a semiconductor structure.

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1A:
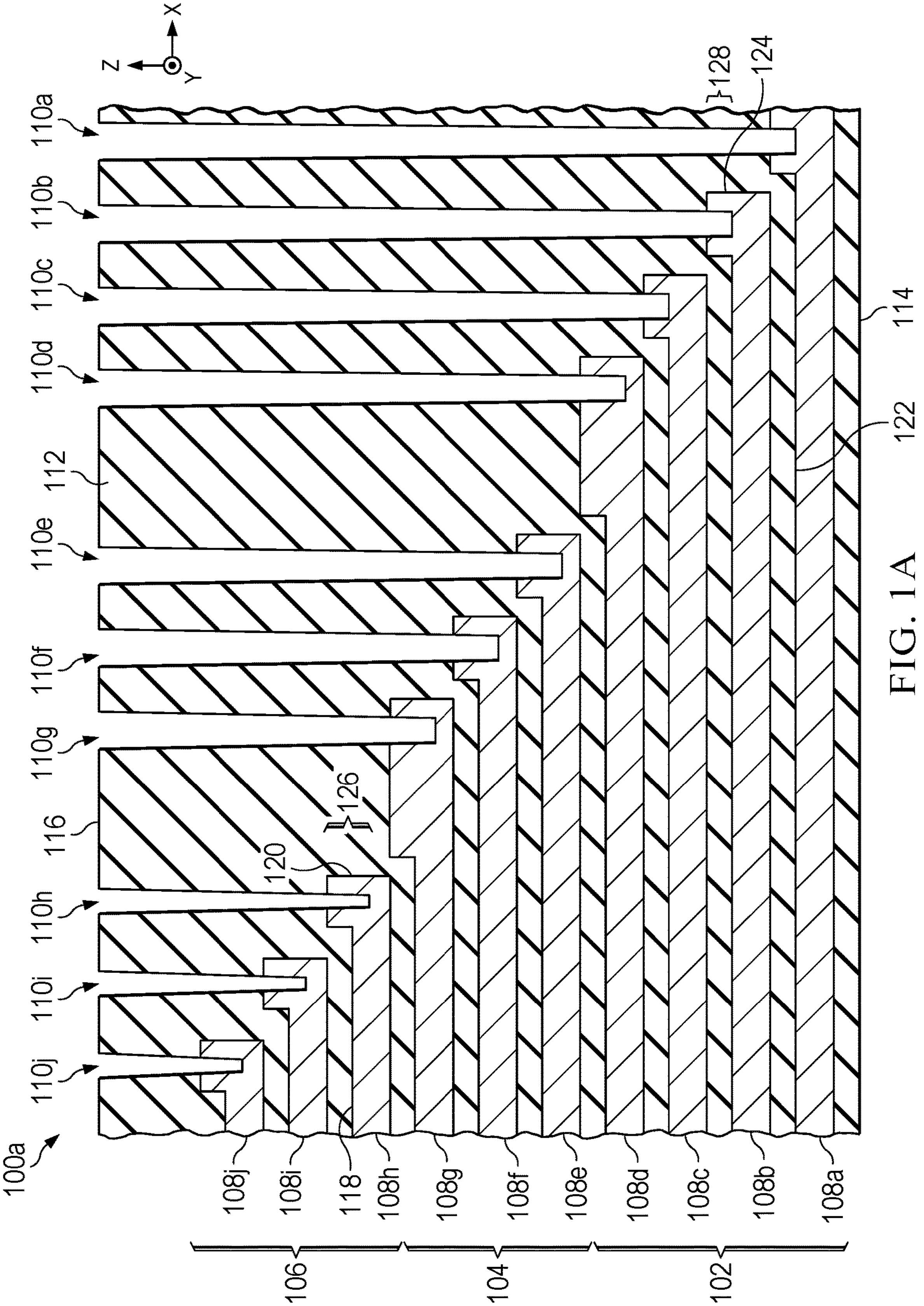
FIGS. 1A-1B illustrate side views of example semiconductor structures.
Figure 1B:
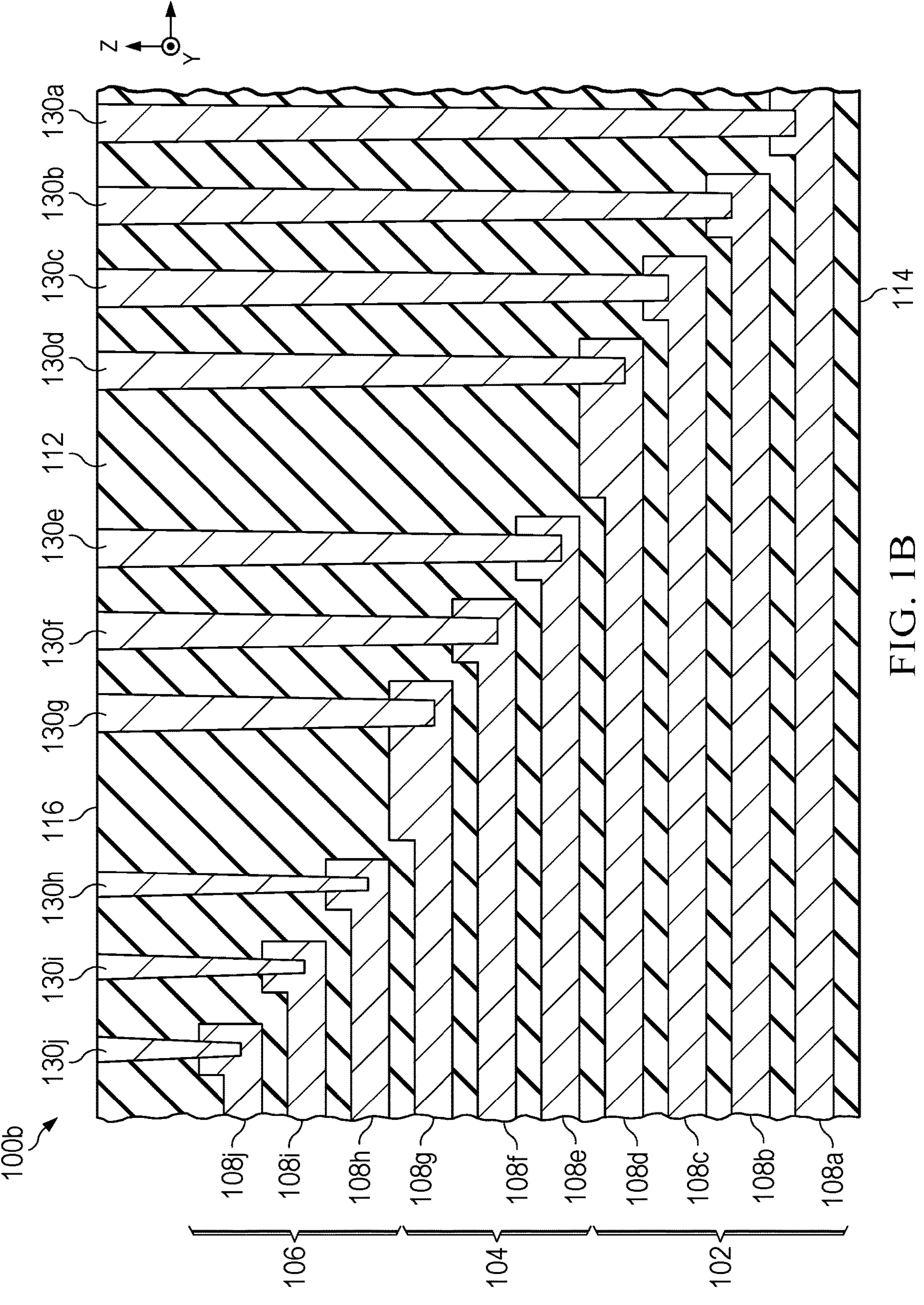

FIG. 1A illustrates a side view of a cross-section of an example semiconductor structure 100*a*. FIG. 1B illustrates a side view of a cross-section of an example semiconductor structure 100*b*. The semiconductor structures 100*a* and 100*b* can be used to form a memory device, e.g., a 3D NAND memory device.

It is noted that X, Y, and Z axes (also referred to as X, Y, and Z directions) are included in FIGS. 1A-1B to further illustrate the spatial relationship of various components in a semiconductor device. A substrate of the semiconductor device includes two lateral surfaces extending laterally in the X-Y plane: a top surface on the front side of a wafer on which a component of the semiconductor device can be formed, and a bottom surface on the backside opposite to the front side of the wafer. The Z direction is perpendicular to both the X and Y directions. As used herein, whether one component (e.g., a layer or a device) is "on," "above," or "below" another component (e.g., a layer or a device) of the semiconductor device is determined relative to the substrate of the semiconductor device in the Z direction (the vertical direction perpendicular to the X-Y plane, e.g., the thickness direction of the substrate) when the substrate is positioned in the lowest plane of the semiconductor device in the Z direction. The same notion for describing the spatial relationships is applied throughout the present disclosure.

As shown in FIG. 1A, semiconductor structure 100*a* includes conductive layers 108*a*-108*j* and an insulating structure 112 electrically isolating conductive layers 108*a*-108*j*. Each of conductive layers 108*a*-108*j* can include one or more conductive materials including, but not limited to, tungsten (W), cobalt (Co), copper (Cu), aluminum (Al), silicides, or any combination thereof. The insulating structure 112 can include one or more dielectric materials including, but not limited to, silicon oxide, silicon nitride, silicon oxynitride, low dielectric constant (low-k) dielectrics, or any combination thereof. Conductive layers 108*a*-108*j* extend along a horizontal direction (e.g., the X direction) and can be included in multiple decks (e.g., decks 102, 104, and 106) stacked over one another along a vertical direction (e.g., the Z direction). The numbers of conductive layers in each deck can be the same or different. Each conductive layer includes a landing portion and a non-landing portion adjacent to each other along the X direction. For example, conductive layer 108*b* in deck 102 includes landing portion 124 and non-landing portion 122, and conductive layer 108*h* in deck 106 includes landing portion 120 and non-landing portion 118. A landing portion of each conductive layer is thicker than a non-landing portion of the conductive layer along the Z direction. Semiconductor structure 100*a* has two lateral surfaces 114 and 116. Semiconductor structure 100*a* further includes contact holes 110*a*-110*j*. Each of contact holes 110*a*-110*j* extends along the Z direction from surface 116 and into a landing portion of a respective conductive layer of conductive layers 108*a*-108*j*. Conductive layers 108*a*-108*j* extend by different lengths along the X direction to form a staircase-like structure. That is, landing portions of conductive layers 108*a*-108*j* are located at different positions along the X direction. As such, each of contact holes 110*a*-110*j* can extend into a corresponding conductive layer of conductive layers 108*a*-108*j* and bypass other conductive layers.

In some implementations, contact holes 110*a*-110*j* can be formed during one etching process (e.g., dry etching). For example, a lithography process can be performed to pattern openings of contact holes 110*a*-110*j* on surface 116 using an etch mask (e.g., a photoresist mask and/or a hard mask), and a dry etching process, such as reactive-ion etching (RIE), can be performed to etch insulating structure 112 and conductive layers 108*a*-108*j* to form contact holes 110*a*-110*j*. As the etching process proceeds, each of contact holes 110*a*-110*j* can start from surface 116, grow deeper and deeper, extend through the dielectric material over conductive layers 108*a*-108*j*, and extend into a corresponding conductive layer. During the etching process, contact holes 110*a*-110*j* may reach corresponding conductive layers at different times, because distances between conductive layers 108*a*-108*j* and surface 116 along the Z direction are different, and it may take longer to etch off the dielectric material over a conductive layer further away from surface 116. Thus, a recess or space formed in a landing portion of a conductive layer by a corresponding contact hole has a greater dimension (or depth) along the Z direction if the conductive layer is closer to surface 116. For example, as shown in FIG. 1A, a recess in landing portion 120 of conductive layer 108*h* has a depth 126, which is greater than a depth 128 of a recess in landing portion 124 of conductive layer 108*b*, because conductive layer 108*h* is closer to surface 116. Having a thicker landing portion in a conductive layer can prevent the conductive layer from being penetrated through by a corresponding contact hole. In other words, thickness of landing portions can serve as a buffer margin to accommodate various depths of recesses caused by the contact holes.

As shown in FIG. 1B, semiconductor structure 100*b* can be formed from semiconductor structure 100*a* by forming contact structures 130*a*-130*j* in contact holes 110*a*-110*j*. Each of contact structures 130*a*-130*j* can include one or more conductive materials including, but not limited to, W, Co, Cu, Al, silicides, or any combination thereof. Contact structures 130*a*-130*j* can be formed, for example, by depositing the conductive materials into contact holes 110*a*-110*j*. Since each of contact holes 110*a*-110*j* does not extend through a corresponding conductive layer (as described with respect to FIG. 1A), the contact structure formed in the contact hole also does not extend through the corresponding conductive layer. If the contact structure extends into the insulating structure 112 below the conductive layer (e.g., closer to surface 114) or even is in contact with another conductive layer, it may cause a short circuit, which may introduce a leakage current or change a parasitic capacitance between two conductive layers, thereby affecting an electrical performance of a device formed by the semiconductor structure 100*b*.

Implementations of the present disclosure provide techniques for forming thicker landing portions for conductive layers in a semiconductor structure, which can reduce the complexity and cost of the fabrication process. As described below in detail, the techniques implemented herein can prevent a contact structure from extending through a corresponding conductive layer during manufacture.

Figure 2A:
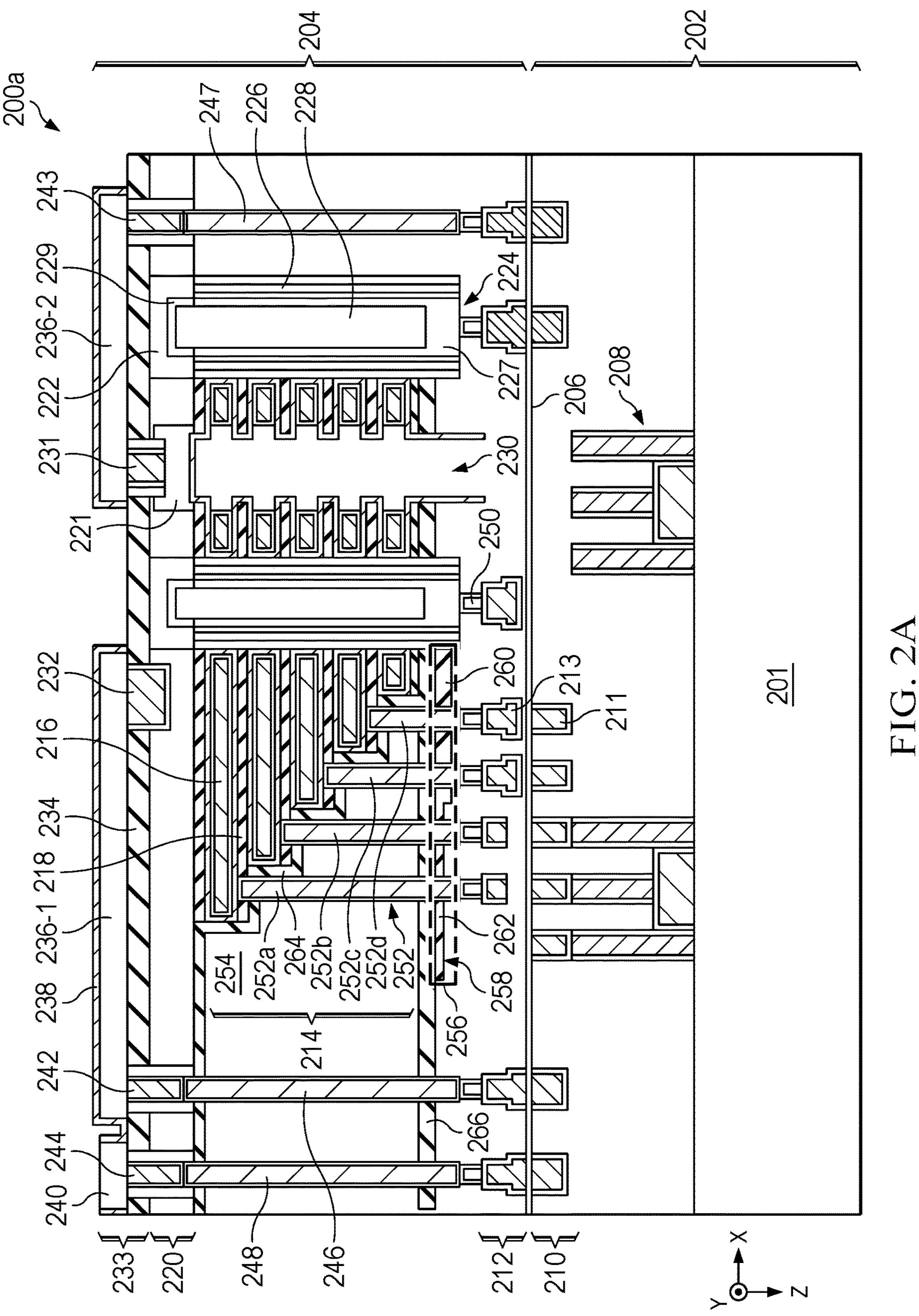
FIGS. 2A-2B illustrate side views of some other example semiconductor structures.

FIG. 2A illustrates a side view of a cross-section of an example 3D memory device 200*a*. In some implementations, 3D memory device 200*a* is a bonded chip including a first semiconductor structure 202 and a second semiconductor structure 204 stacked over first semiconductor structure 202. First and second semiconductor structures 202 and 204 are jointed at a bonding interface 206 therebetween, according to some implementations. As shown in FIG. 2A, first semiconductor structure 202 can include a substrate 201, which can include silicon (e.g., single crystalline silicon, c-Si), SiGe, GaAs, Ge, SOI, or any other suitable materials.

First semiconductor structure 202 of 3D memory device 200*a* can include peripheral circuits 208 on substrate 201. In some implementations, peripheral circuit 208 is configured to control and sense 3D memory device 200*a*. Peripheral circuit 208 can be any suitable digital, analog, and/or mixed-signal control and sensing circuits used for facilitating the operation of 3D memory device 200*a* including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

As shown in FIG. 2A, first semiconductor structure 202 of 3D memory device 200*a* can further include a bonding layer 210 at bonding interface 206 and above the interconnect layer and peripheral circuits 208. Bonding layer 210 can include a plurality of bonding contacts 211 and dielectrics electrically isolating bonding contacts 211. Bonding contacts 211 can include conductive materials including, but not limited to, W, Co, Cu, Al, silicides, or any combination thereof. The remaining area of bonding layer 210 can be formed with dielectrics including, but not limited to, silicon oxide, silicon nitride, silicon oxynitride, low-k dielectrics, or any combination thereof. Bonding contacts 211 and surrounding dielectrics in bonding layer 210 can be used for hybrid bonding.

Similarly, as shown in FIG. 2A, second semiconductor structure 204 of 3D memory device 200*a* can also include a bonding layer 212 at bonding interface 206 and above bonding layer 210 of first semiconductor structure 202. Bonding layer 212 can include a plurality of bonding contacts 213 and dielectrics electrically isolating bonding contacts 213. Bonding contacts 213 can include conductive materials including, but not limited to, W, Co, Cu, Al, silicides, or any combination thereof. The remaining area of bonding layer 212 can be formed with dielectrics including, but not limited to, silicon oxide, silicon nitride, silicon oxynitride, low-k dielectrics, or any combination thereof. Bonding contacts 213 and surrounding dielectrics in bonding layer 212 can be used for hybrid bonding. Bonding contacts 213 are in contact with bonding contacts 211 at bonding interface 206, according to some implementations.

As described below in detail, second semiconductor structure 204 can be bonded on top of first semiconductor structure 202 in a face-to-face manner at bonding interface 206. In some implementations, bonding interface 206 is disposed between bonding layers 210 and 212 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 206 is the place at which bonding layers 212 and 210 are met and bonded. In practice, bonding interface 206 can be a layer with a certain thickness that includes the top surface of bonding layer 210 of first semiconductor structure 202 and the bottom surface of bonding layer 212 of second semiconductor structure 204.

In some implementations, 3D memory device 200*a* is a NAND Flash memory device in which memory cells are provided in the form of an array of NAND memory strings. As shown in FIG. 2A, second semiconductor structure 204 of 3D memory device 200*a* can include an array of channel structures 224 functioning as the array of NAND memory strings. As shown in FIG. 2A, each channel structure 224 can extend vertically through a plurality of pairs each including a conductive layer 216 and an insulating layer 218. The interleaved conductive layers 216 and insulating layers 218 are part of a memory stack 214. The number of the pairs of conductive layers 216 and insulating layers 218 in memory stack 214 (e.g., 32, 64, 96, 128, 160, 192, 224, 256, or more) determines the number of memory cells in 3D memory device 200*a*. It is understood that in some implementations, memory stack 214 may have a multi-deck architecture (not shown in FIG. 2A), which includes a plurality of memory decks stacked over one another. An example of the multi-deck architecture will be described below with respect to FIG. 2B. The numbers of the pairs of conductive layers 216 and insulating layers 218 in each memory deck can be the same or different.

Memory stack 214 can include a plurality of interleaved conductive layers 216 and insulating layers 218. Conductive layers 216 and insulating layers 218 in memory stack 214 can alternate in the vertical direction (e.g., the Z direction). In other words, except the ones at the top or bottom of memory stack 214, each conductive layer 216 can be adjoined by two insulating layers 218 on both sides, and each insulating layer 218 can be adjoined by two conductive layers 216 on both sides. Conductive layers 216 can include conductive materials including, but not limited to, W, Co, Cu, Al, polysilicon, doped silicon, silicides, or any combination thereof. Each conductive layer 216 can include a gate electrode (gate line) surrounded by an adhesive layer and a gate dielectric layer. The gate electrode of conductive layer 216 can extend laterally as a word line, ending at one or more staircase structures of memory stack 214. Insulating layers 218 can include dielectric materials including, but not limited to, silicon oxide, silicon nitride, silicon oxynitride, or any combination thereof.

As shown in FIG. 2A, second semiconductor structure 204 of 3D memory device 200*a* can also include a P-type doped semiconductor layer 220 above memory stack 214. P-type doped semiconductor layer 220 can be an example of the "sidewall SEG" as described above. P-type doped semiconductor layer 220 can include a semiconductor material, such as silicon. In some implementations, second semiconductor structure 204 of 3D memory device 200*a* further includes an N-well 221 in P-type doped semiconductor layer 220.

In some implementations, each channel structure 224 includes a channel hole filled with a semiconductor layer (e.g., as a semiconductor channel 228) and a composite dielectric layer (e.g., as a memory film 226). In some implementations, semiconductor channel 228 includes silicon, such as amorphous silicon, polysilicon, or single crystalline silicon. In some implementations, memory film 226 is a composite layer including a tunneling layer, a storage layer (also known as a "charge trap layer"), and a blocking layer. The remaining space of channel structure 224 can be partially or fully filled with a capping layer including dielectric materials, such as silicon oxide, and/or an air gap. Channel structure 224 can have a cylinder shape (e.g., a pillar shape). The capping layer, semiconductor channel 228, the tunneling layer, storage layer, and blocking layer of memory film 226 are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 226 can include a composite layer of silicon oxide/silicon oxynitride/silicon oxide (ONO).

As shown in FIG. 2A, second semiconductor structure 204 of 3D memory device 200*a* can further include insulating structures 230 each extending vertically through interleaved conductive layers 216 and insulating layers 218 of memory stack 214. Each insulating structure 230 can also extend laterally to separate channel structures 224 into a plurality of blocks. That is, memory stack 214 can be divided into a plurality of memory blocks by insulating structures 230, such that the array of channel structures 224 can be separated into each memory block.

In some implementations, 3D memory device 200*a* can include backside source contacts 231 and 232 above memory stack 214 and in contact with N-well 221 and P-type doped semiconductor layer 220, respectively, as shown in FIG. 2A.

As shown in FIG. 2A, 3D memory device 200*a* can further include a BEOL (back end of line) interconnect layer 233 above and electrically connected to source contacts 231 and 232 for pad-out, e.g., transferring electrical signals between 3D memory device 200*a* and external circuits.

In some implementations, 3D memory device 200*a* further includes peripheral contacts, e.g., 246, 247, and 248, each extending vertically outside of memory stack 214. Each peripheral contact 246, 247, or 248 can have a depth greater than the depth of memory stack 214 to extend vertically from bonding layer 212 to P-type doped semiconductor layer 220 in a peripheral region that is outside of memory stack 214.

As shown in FIG. 2A, 3D memory device 200*a* also includes a variety of local contacts (also known as "C1") as part of the interconnect structure, which are in contact with a structure in memory stack 214 directly. In some implementations, the local contacts include channel local contacts 250 each below and in contact with the lower end of respective channel structure 224. Each channel local contact 250 can be electrically connected to a bit line contact (not shown) for bit line fan-out. In some implementations, the local contacts further include contact structures 252*a*-252*d* (also referred to as word line local contacts) each below and in contact with respective conductive layer 216 (including a word line) at the staircase structure of memory stack 214 for word line fan-out. Local contacts, such as channel local contacts 250 and word line local contacts 252*a*-252*d*, can be electrically connected to peripheral circuits 208 of first semiconductor structure 202 through at least bonding layers 212 and 210. Local contacts, such as channel local contacts 250 and word line local contacts 252*a*-252*d*, each can include one or more conductive layers, such as a metal layer (e.g., W, Co, Cu, or Al) or a silicide layer surrounded by an adhesive layer (e.g., TiN). Contact structures 252*a*-252*d* have different lengths along the Z direction. For example, a length of contact structure 252*a* is greater than a length of contact structure 252*d*.

3D memory device 200*a* includes insulating structures 254 and 256. Insulating structure 254 can be in contact with the staircase structure of memory stack 214. In some implementation, a protection layer 264 is between insulating structure 254 and the staircase structure of memory stack 214. In some implementations, insulating structure 254 includes a dielectric material including, but not limited to, silicon oxide, silicon nitride, silicon oxynitride, low dielectric constant (low-k) dielectrics, or any combination thereof. Insulating structures 254 and 256 are stacked along the Z direction. In some implementations, Insulating structure 266 is between insulating structures 254 and 256. Insulating structure 256 can extend along the X direction. In some implementations, insulating structure 256 includes a layer 258 extending along the X direction. Layer 258 includes a material (e.g., a dielectric material) having an etching rate smaller than an etching rate of the dielectric material of insulating structure 254. In some implementations, layer 258 includes a first portion 260 and a second portion 262 adjacent to each other along the X direction. A thickness of the first portion 260 (along the Y direction) is greater than a thickness of the second portion 262 (along the Y direction). Contact structures 252*a*-252*d* extend through layer 258. A longer contact structure (e.g., 252*a*) extends through the second portion 262, and a shorter contact structure (e.g., 252*d*) extends through the first portion 260.

Figure 2B:
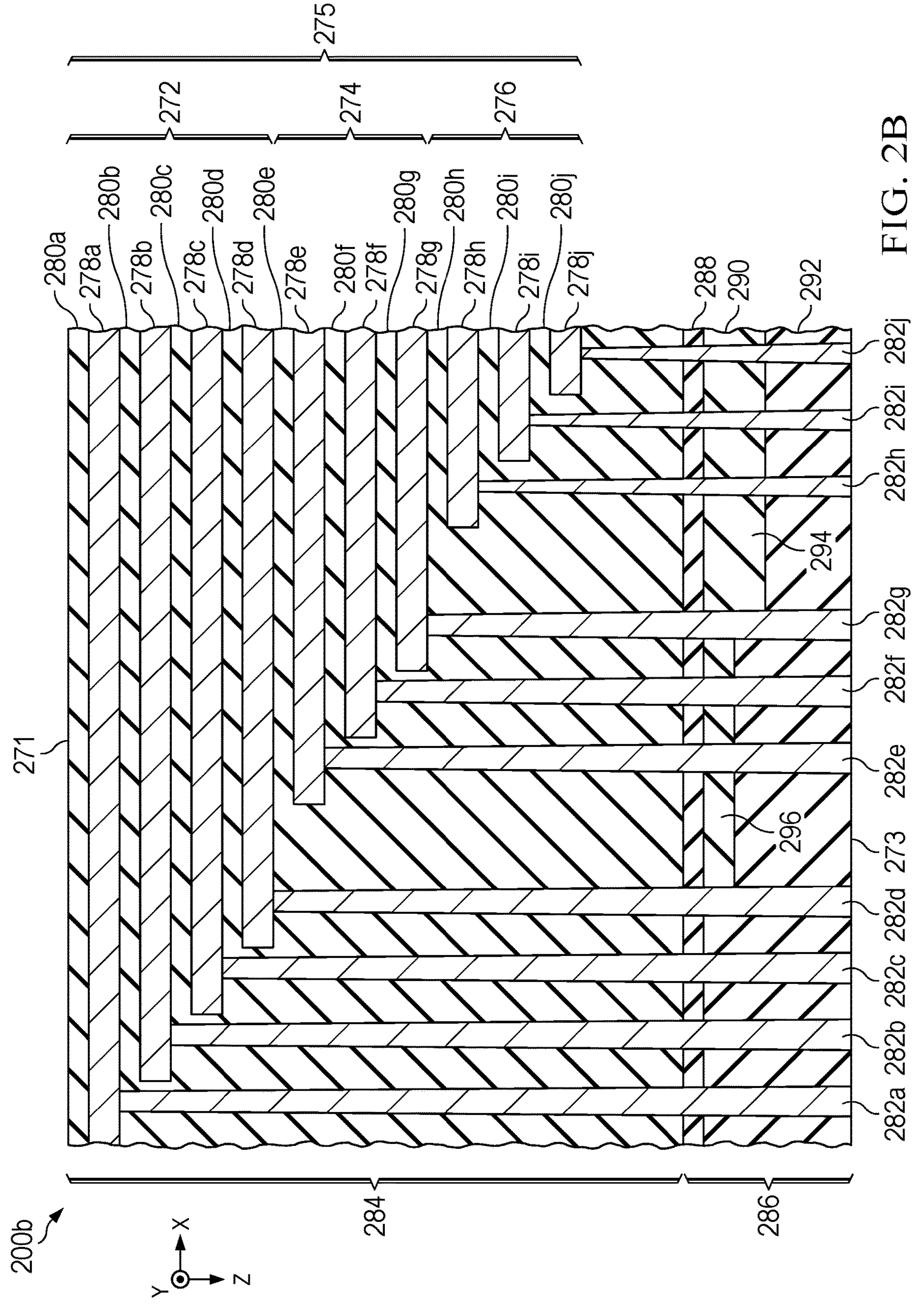

FIG. 2B illustrates a side view of a cross-section of an example semiconductor structure 200*b*, according to some aspects of the present disclosure. In some implementations, semiconductor structure 200*b* can be used to form a memory device (e.g., semiconductor structure 204 in 3D NAND memory device 200*a* of FIG. 2A). A stack 275 in semiconductor structure 200*b* includes interleaved conductive layers 278*a*-278*j* and insulating layers 280*a*-280*j*. Stack 275 can include decks 272, 274, and 276 stacked along the vertical direction (e.g., the Z direction). Each of decks 272, 274, and 276 includes alternative conductive layers and insulating layers (e.g., conductive layers 278*a*-278*d* and insulating layers 280*a*-280*d* in deck 272, conductive layers 278*e*-278*g* and insulating layers 280*e*-280*g* in deck 274, and conductive layers 278*h*-278*j* and insulating layers 280*h*-280*j* in deck 276) along the Z direction. Each of conductive layers 278*a*-278*j* can include one or more conductive materials including, but not limited to, W, Co, Cu, Al, silicides, or any combination thereof. Each of insulating layers 280*a*-280*j* can include one or more dielectric materials including, but not limited to, silicon oxide, silicon nitride, silicon oxynitride, low-k dielectrics, or any combination thereof. Conductive layers 278*a*-278*j* and insulating layers 280*a*-280*j* extend along the horizontal direction (e.g., the X direction). The numbers of conductive layers in each deck can be the same or different. In some implementations, stack 275 can be an example of memory stack 214 of 3D NAND memory device 200*a* of FIG. 2A, and conductive layers 278*a*-278*j* can extend laterally as word lines of a 3D NAND memory device (e.g., conductive layers 216 of 3D NAND memory device 200*a* of FIG. 2A). In some implementations, each of conductive layers 278*a*-278*j* has an edge portion thinner than an inner portion along the Z direction. It is understood that the number of conductive layers **278*a*-278*j* and insulating layers 280*a*-280*j* shown in FIG. 2B is for illustration only and that any suitable number of conductive layers and the insulating layers can be included in stack 275**.

Conductive layers **278*a*-278*j* extend by different lengths along the horizontal direction and form a "staircase structure" or a "stepped cavity structure" in stack 275. The terms "staircase structure," "stepped cavity structure," or similar refer to a structure having stepped surfaces. In the present disclosure, "stepped surfaces" refer to a set of surfaces that include at least two horizontal surfaces (e.g., along x-y plane) and at least two (e.g., first and second) vertical surfaces (e.g., along the z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. Semiconductor structure 200*b* has two lateral surfaces 271 and 273. Semiconductor structure 200*b* further includes contact structures 282*a*-282*j*. Contact structures 282*a*-282*j* extends along the Z direction from surface 273 and are connected to respective conductive layers 278*a*-278*j*. The staircase structure of stack 275 enables each of contact structures 282*a*-282*j* to be connected to one of conductive layers 108*a*-108*j* and bypass other conductive layers. Contact structures 282*a*-282*j*** can have different length along the Z direction.

Semiconductor structure **200*b* includes insulating structures 284 and 286. Insulating structure 284 can be in contact with the staircase structure of stack 275. In some implementation (as shown in FIG. 2B), insulating structure 284 and insulating layers 280*a*-280*j* of stack 275 form a continuous structure. In some implementations, insulating structure 284 and insulating layers 280*a*-280*j* include the same dielectric material including, but not limited to, silicon oxide, silicon nitride, silicon oxynitride, low dielectric constant (low-k) dielectrics, or any combination thereof. Insulating structures 284 and 286** are stacked along the Z direction.

As shown in FIG. 2B, insulating structure 286 extends along the X direction. In some implementations, insulating structure 286 includes a first layer 290 extending along the X direction. The first layer 290 includes a material (e.g., a dielectric material) having an etching rate smaller than an etching rate of the dielectric material of insulating structure 284. In some implementations, the first layer 290 includes a first portion 294 and a second portion 296 adjacent to each other along the X direction. A thickness of the first portion 294 (along the Z direction) is greater than a thickness of the second portion 296 (along the Z direction). In some implementations, as shown in FIG. 2B, the first layer 290 has a stepped shape or a staircase shape. In some implementations, the first layer 290 can have a slope shape. Contact structures **282*a*-282*j* extend through insulating structure 286. Some of contact structures 282*a*-282*j* (e.g., contact structures 282*e*-282*j*) extend through the first layer 290. As shown in FIG. 2B, longer contact structures (e.g., 282*e*-282*g*) extend through the second portion 296, and shorter contact structures (e.g., 282*h*-282*j*) extend through the first portion 294**.

In some implementations, insulating structure 286 includes a second layer 292 and a third layer 288. The second layer 292 shares the same surface 273 with insulating structure 286 on one side and is in contact with both the first layer 290 and the third layer 288 on the other side. The third layer 288 extends along the X direction and is adjoined by the insulating structure 284 and the first layer 290 on both sides. That is, the third layer 288 is between conductive layers **278*j* and the first layer 290. In some implementations, contact structures 282*a*-282*j* extend through the second layer 292 and the third layer 288, and some of contact structures 282*a*-282*j* (e.g., 282*a*-282*d*) bypass the first layer 290. In some implementations, the second layer 292 and insulating structure 284 includes the same dielectric material. In some implementations, the third layer 288 includes a material having an etching rate smaller than the material of the first layer 290**.

In some implementations, contact structures **282*a*-282*j* have different cross section areas at a same position along the Z direction. For example, a size of a cross section area of a shorter contact structure (e.g., contact structure 282*h*) is smaller than a size of a cross section area of a longer contact structure (e.g., contact structure 282*a***) at the same position along the Z direction.

In some implementations, conductive layers in the same deck are connected to contact structures that extend through the same portion of the first layer 290. For example, as shown in FIG. 2B, conductive layers **278*h*, 278*i*, and 278*j* of deck 276 are connected to contact structures 282*h*, 282*i*, and 282*j* respectively, and contact structures 282*h*, 282*i*, and 282*j* extend through the first portion 294 of the first layer 290. In some implementations, conductive layers in the same deck are connected to contact structures that extend through different portions of the first layer 290. For example, contact structures 282*i* and 282*j* can extend through the first portion 294 of the first layer 290, and contact structures 282*h* can extend through the second portion 296 of the first layer 290 (not shown in FIG. 2**B).

It is understood that while the first layer 290 in FIG. 2B includes two portions, in some implementations, the first layer 290 may include any suitable number of portions of different thicknesses (e.g., one portion, two portions, or more than two portions). In some implementations, a shorter contact structure and a longer contact structure of semiconductor structure **200*b* may extend through the same portion of the first layer 290. In some other implementations, a thickness of a portion of the first layer 290 that the shorter contact structure extends through is greater than a thickness of a portion of the first layer 290** that the longer contact structure extends through.

In some implementations, insulating structure 286 can include multiple portions arranged along the X direction. The multiple portions can have the same thickness along the Z direction. In some implementations, the multiple portions can be doped with different types of dopants, with the same dopant but using different doping concentrations, or a combination thereof. The multiple portions can have different etching rates. In some implementations, a shorter contact structure and a longer contact structure of semiconductor structure **200*b* may extend through the same portion of insulating structure 286. In some other implementations, an etching rate of a portion of insulating structure 286 that the shorter contact structure extends through is smaller than an etching rate of a portion of insulating structure 286** that the longer contact structure extends through.

In some implementations, semiconductor structure **200*b* is an array wafer (e.g., semiconductor structure 204 of FIG. 2A) of a 3D NAND memory device. The array wafer can include an array region and a connection region. Conductive layers 278*a*-278*j* can extend along the X direction from the array region into the connection region. Contact structures 282*a*-282*j* extend through the connection region along the Z direction. In some implementations, the array region includes channel structures. The channel structures and the conductive layers 278***a*-278*j* form one or more memory cell arrays of the 3D NAND memory device. In some implementations, the 3D NAND memory device further includes a complementary metal-oxide-semiconductor (CMOS) wafer (e.g., semiconductor structure 202 of FIG. 2A). The CMOS wafer can include peripheral circuits of the one or more memory cell arrays. The array wafer and the CMOS wafer can be bonded together through a bonding interface (e.g., bonding interface 206 of FIG. 2A).

Figure 3A:
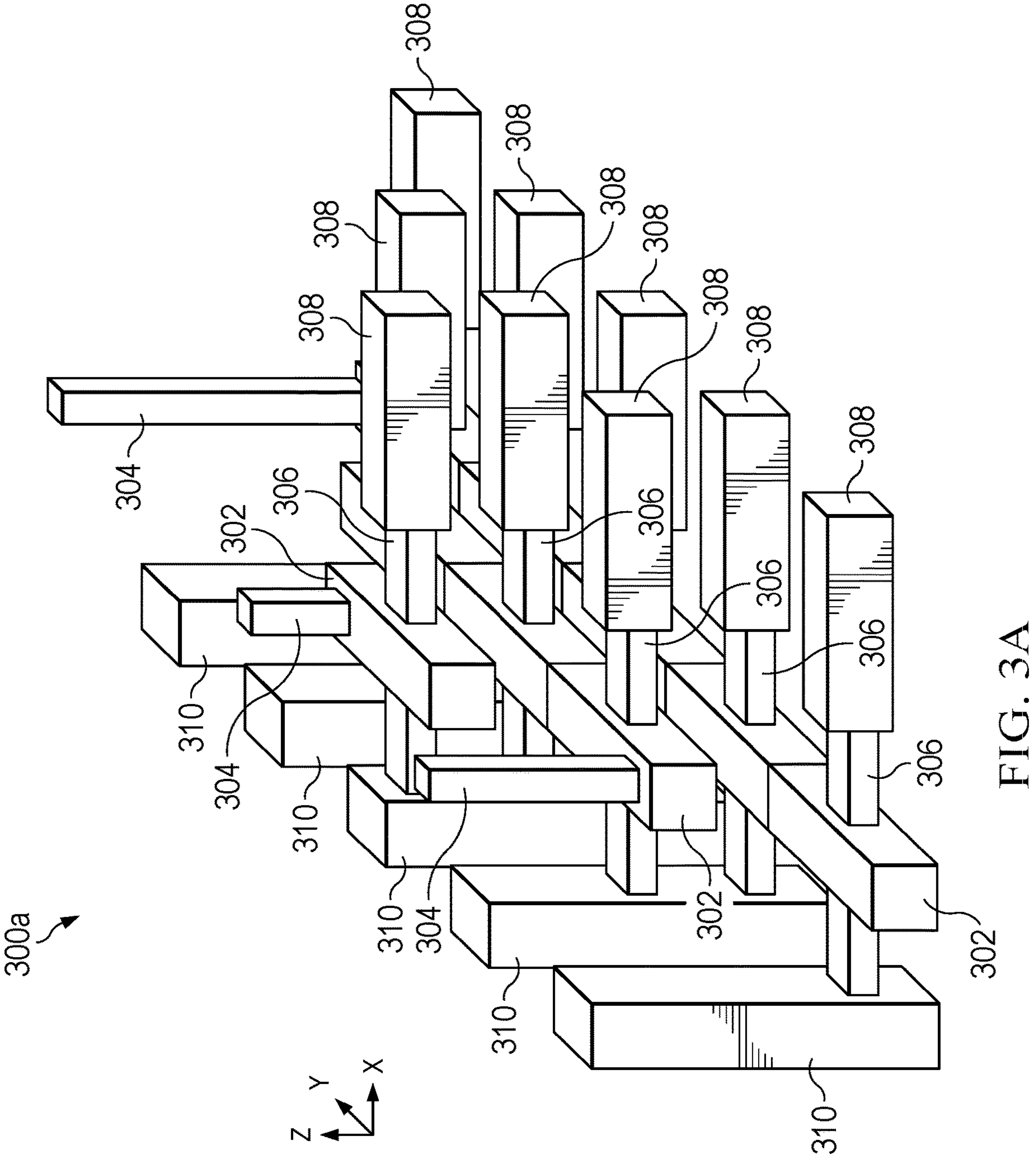
FIGS. 3A-3B illustrate example three-dimensional (3D) dynamic random-access memory (DRAM) devices.
Figure 3B:
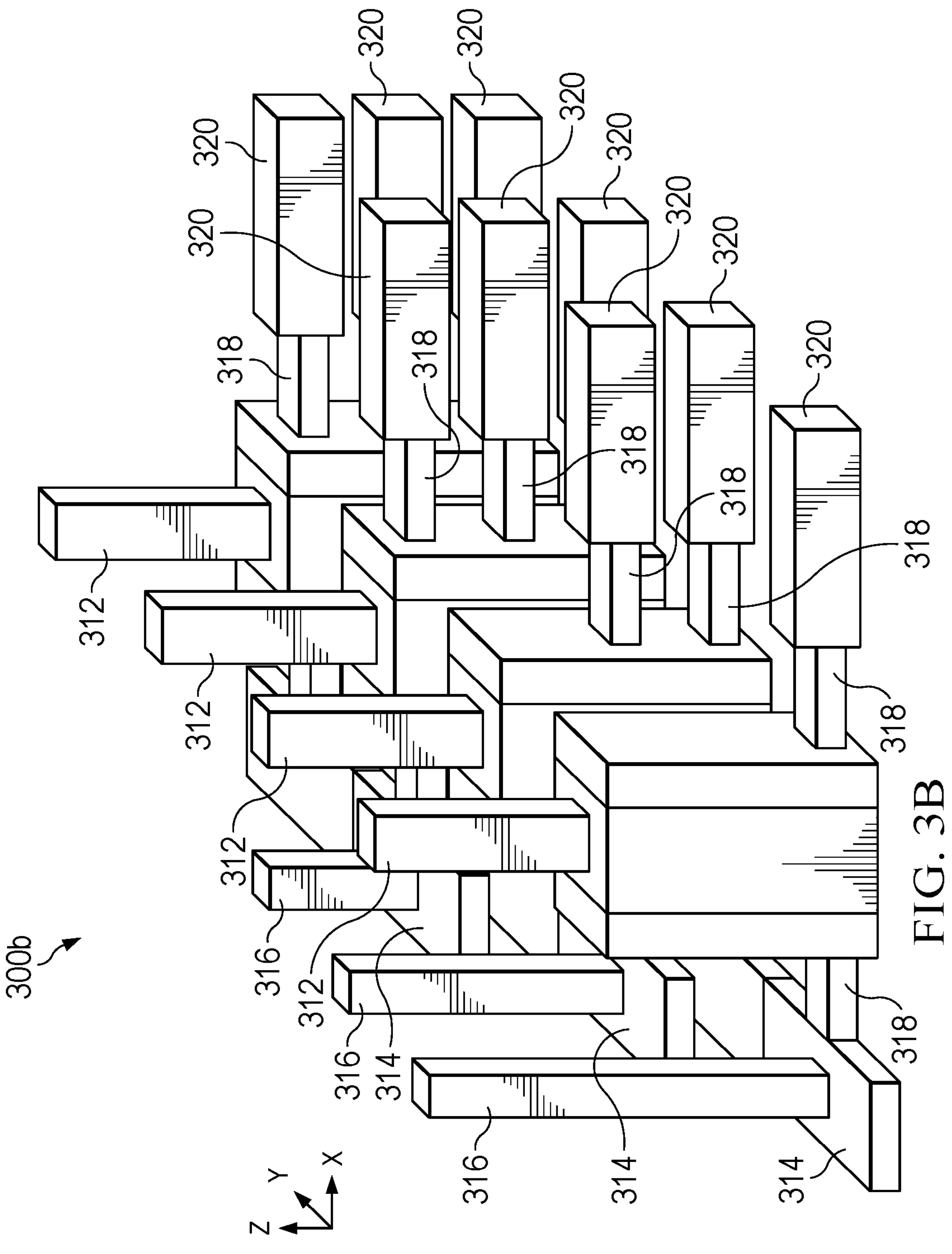

FIGS. 3A-3B illustrate example 3D dynamic random-access memory (DRAM) devices 300*a* and 300*b*. As shown in FIG. 3A, 3D DRAM device 300*a* includes word lines 302, word line extensions 304, semiconductor pillars 306, cell storage capacitors 308, and bit lines 310. Word lines 302 extend along the Y direction. Each word line 302 is connected to a respective word line extension 304 extending along the Z direction. Each word line 302 is connected to at least one semiconductor pillar 306 extending along the X direction. Each semiconductor pillar 306 is connected to a respective cell storage capacitor 308. In some implementations, each semiconductor pillar 306 is part of a vertical transistor. 3D DRAM device 300*a* can include an array of DRAM memory cells. Each DRAM memory cell of 3D DRAM device 300*a* can include one semiconductor pillar 306 and one cell storage capacitor 308 connected together. In some implementations, semiconductor structure 200*b* of FIG. 2B can be a 3D DRAM device (e.g., 3D DRAM device 300*a* of FIG. 3A). Specifically, word lines 302 of FIG. 3A can be examples of conductive layers 278*a*-278*j* of FIG. 2B, and word line extensions 304 of FIG. 3A can be examples of contact structures 282*a*-282*j* of FIG. 2B.

As shown in FIG. 3B, 3D DRAM device 300*b* includes word lines 312, bit lines 314, bit line extensions 316, semiconductor pillars 318, and cell storage capacitors 320. Word lines 312 extend along the Z direction. Bit lines 314 extend along the Y direction. Each bit line 314 is connected to a respective bit line extension 316 extending along the Z direction. Each bit line 314 is connected to at least one semiconductor pillar 318 extending along the X direction. Each semiconductor pillar 318 is connected to a respective cell storage capacitor 320. In some implementations, each semiconductor pillar 318 is part of a vertical transistor. 3D DRAM device 300*b* can include an array of DRAM memory cells. Each DRAM memory cell of 3D DRAM device 300*b* can include one semiconductor pillar 318 and one cell storage capacitor 320 connected together. In some implementations, semiconductor structure 200*b* of FIG. 2B can be a 3D DRAM device (e.g., 3D DRAM device 300*b* of FIG. 3B). Specifically, bit lines 314 of FIG. 3B can be examples of conductive layers 278*a*-278*j* of FIG. 2B, and bit line extensions 316 of FIG. 3B can be examples of contact structures 282*a*-282*j* of FIG. 2B.

FIGS. 4A-4F illustrate a fabrication process for forming an example semiconductor structure. Each structure shown in FIGS. 4A-4F can be similar to, or same as, one of semiconductor structures or devices 200*a*, 200*b*, 300*a*, and 300*b* of FIGS. 2A, 2B, 3A, and 3B or a structure at an intermediate fabrication process of semiconductor structures or devices 200*a*, 200*b*, 300*a*, and 300*b*.

Figure 4A:
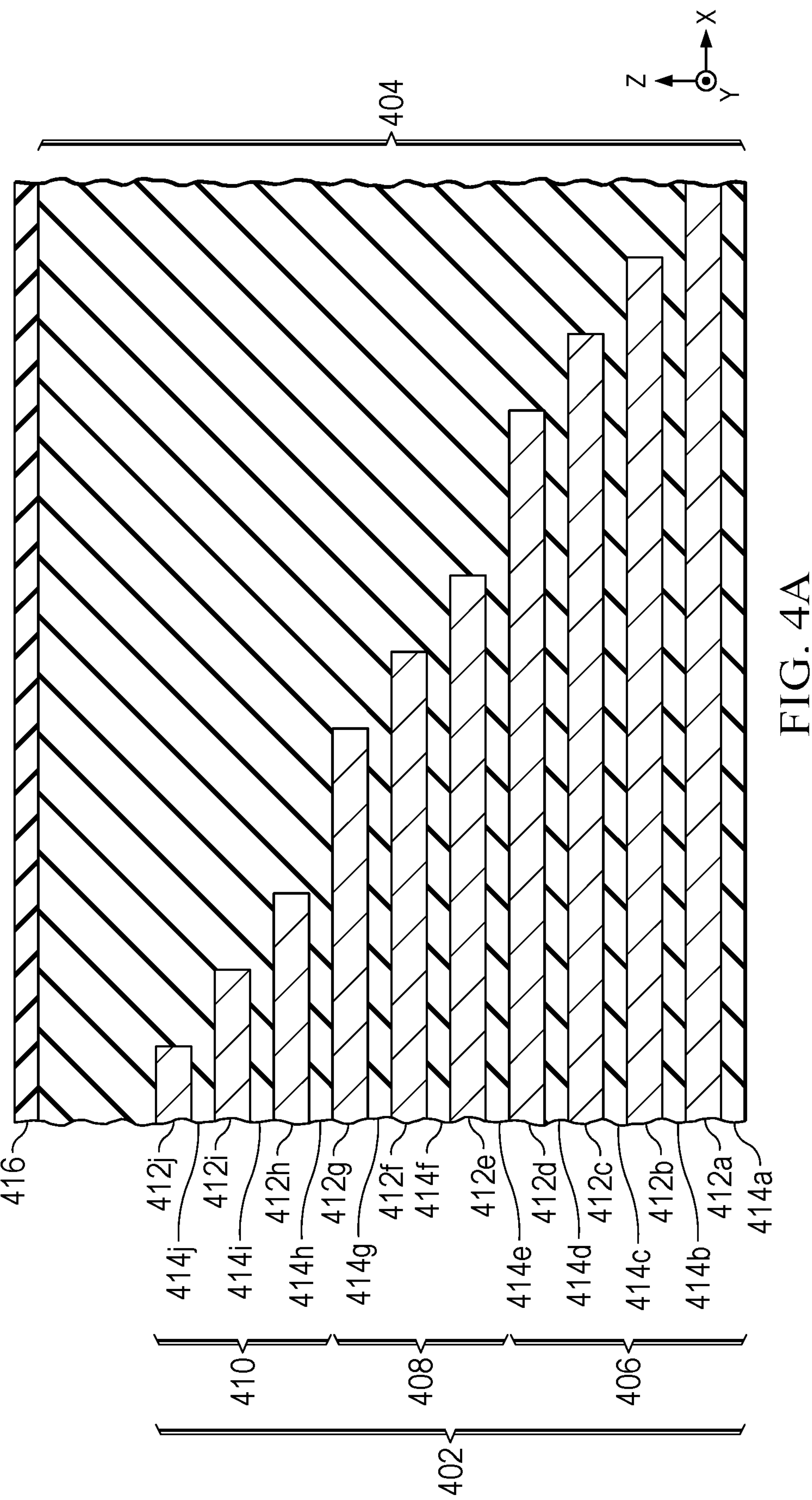
FIGS. 4A-4F illustrate a fabrication process for forming an example semiconductor structure.

As shown in FIG. 4A, stack 402 and insulating structure 404 are formed. Stack 402 includes interleaved conductive layers 412*a*-412*j* and insulating layers 414*a*-414*j* extending along the horizontal direction (e.g., the X direction). Stack 402 can include decks 406, 408, and 410 stacked along the vertical direction (e.g., the Z direction). Each of decks 406, 408, and 410 includes alternative conductive layers and insulating layers. Each of conductive layers 412*a*-412*j* can include one or more conductive materials including, but not limited to, W, Co, Cu, Al, silicides, or any combination thereof. Each of insulating layers 414*a*-414*j* can include one or more dielectric materials including, but not limited to, silicon oxide, silicon nitride, silicon oxynitride, low-k dielectrics, or any combination thereof. The numbers of conductive layers in each deck can be the same or different. In some implementations, stack 402 can be an example of memory stack 214 of 3D NAND memory device 200*a* of FIG. 2A or stack 275 of semiconductor structure 200*b* of FIG. 2B, and conductive layers 278*a*-278*j* can be examples of conductive layers 216 of 3D NAND memory device 200*a* of FIG. 2A or conductive layers 278*a*-278*j* of semiconductor structure 200*b* of FIG. 2B. It is understood that the number of decks, conductive layers, and insulating layers shown in FIG. 4A is for illustration only and that any suitable number of decks, conductive layers, and insulating layers can be included in stack 402. Conductive layers 412*a*-412*j* extend by different lengths along the horizontal direction and form a staircase structure in stack 402. Stack 402 is positioned in a way such that a conductive layer (e.g., 412*j*) of a smaller dimension (e.g., shorter) along the horizontal direction (e.g., the X direction) is above another conductive layer (e.g., 412*i*) of a greater dimension (e.g., longer) along the horizontal direction (e.g., the X direction).

Insulating structure 404 is in contact with the staircase structure of stack 402. As shown in FIG. 4A, insulating structure 404 and insulating layers 414*a*-414*j* of stack 402 can form a continuous structure. In some implementations, there can be a protection layer between insulating structure 404 and the staircase structure of stack 402 (e.g., as shown in FIG. 2A). In some implementations, insulating structure 404 and insulating layers 414*a*-414*j* include the same dielectric material including, but not limited to, silicon oxide, silicon nitride, silicon oxynitride, low dielectric constant (low-k) dielectrics, or any combination thereof. In some implementations, insulating structure 404 can be formed by filling or depositing the dielectric material over stack 402.

An insulating layer 416 extending along the horizontal direction can be deposited on top of insulating structure 404 using one or more film deposition processes, such as chemical vapor deposition (CVD), physical vapor deposition (PVD), atomic layer deposition (ALD), or any combination thereof. Insulating layer 416 can be an example of the third layer 288 of insulating structure 286 of FIG. 2B. Insulating layer 416 can include a material having an etching rate smaller than an etching rate of the dielectric material of insulating structure 404.

Figure 4B:
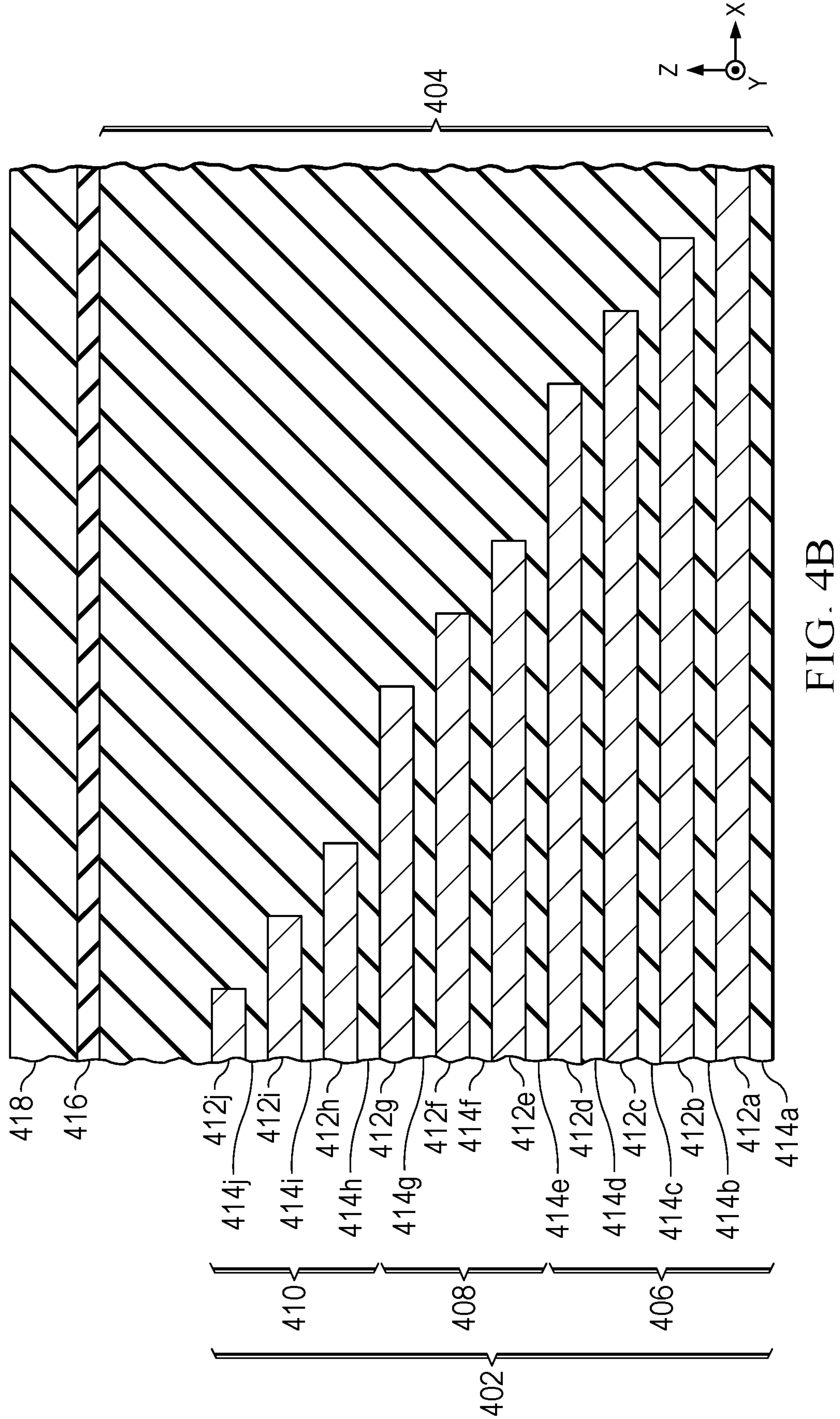

As shown in FIG. 4B, an insulating layer 418 extending along the horizontal direction is deposited on insulating layer 416. Insulating layer 418 can be formed using one or more film deposition processes, such as CVD, PVD, ALD, or any combination thereof. Insulating layer 418 can include a material having an etching rate smaller than an etching rate of the dielectric material of insulating structure 404 but greater than an etching rate of the material of insulating layer 416.

Figure 4C:
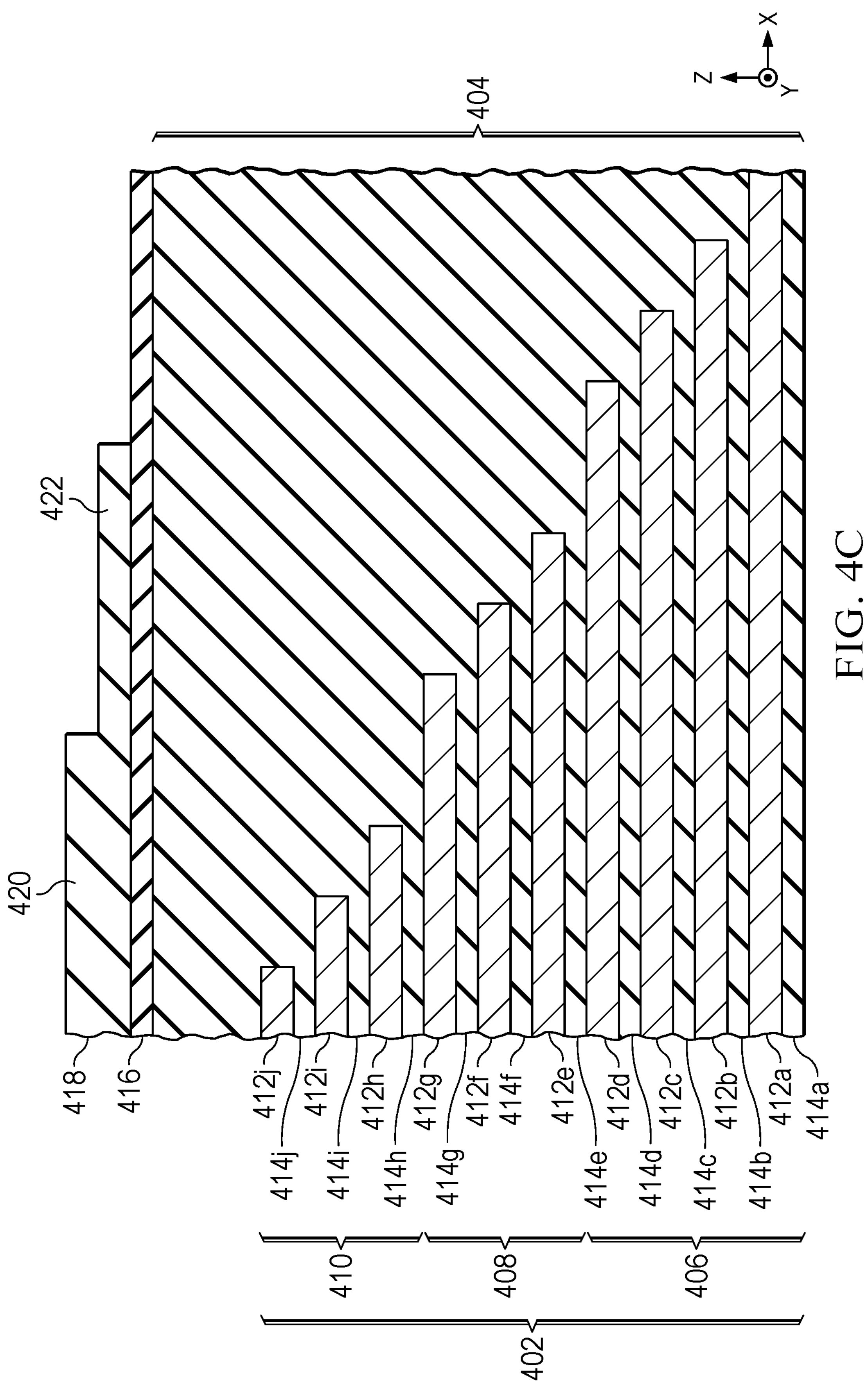

As shown in FIG. 4C, a stepped shape or a staircase structure is formed on insulating layer 418. In some implementations, the staircase structure can be formed by performing multiple trimming and etching processes on insulating layer 418. In some implementations, the insulating layer 416 can prevent insulating structure 404 from being etched off during the trimming and etching processes of insulating layer 418. The staircase structure of insulating layer 418 can include multiple portions of different thicknesses along the vertical direction. For example, the staircase structure of insulating layer 418 can include portion 420 and portion 422 both in contact with insulating layer 416. Portion 420 can be thicker than portion 422. In some implementations, in the trimming and etching processes, a part of insulating layer 418 that was in contact with insulating layer 416 (as shown in FIG. 4B) can be etched off. In some implementations, an end of a conductive layer at a lower position along the vertical direction (e.g., 412*e*) and an end of a conductive layer at a higher position along the vertical direction (e.g., 412*f*) are located below the same portion (e.g., 422) of insulating layer 418. In some implementations, an end of a conductive layer at a lower position along the vertical direction (e.g., 412*e*) is located below a thinner portion (e.g., 422) of insulating layer 418, and an end of a conductive layer at a higher position along the vertical direction (e.g., 412*i*) is located below a thicker portion (e.g., 420) of insulating layer 418.

Figure 4D:
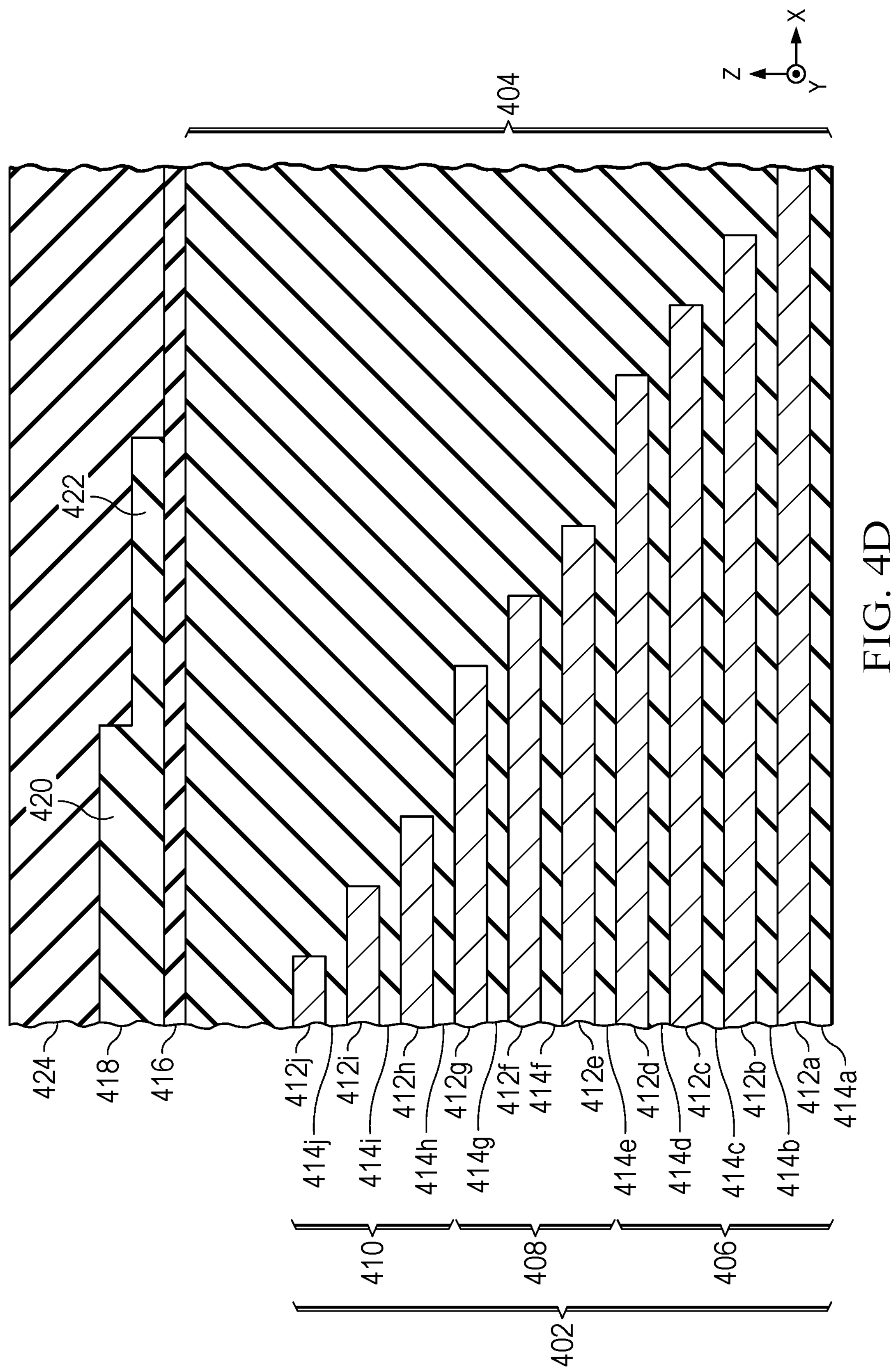

As shown in FIG. 4D, insulating layer 424 is formed over insulating layer 416 and insulating layer 418. Insulating layer 424 can include a material having an etching rate greater than an etching rate of the material of insulating layer 418. Insulating layer 424 can be formed by depositing or filling the material on top of insulating layer 416 and insulating layer 418. In some implementations, insulating layer 424 and insulating structure 404 can include the same material. In some implementations, insulating layer 424 includes a dielectric material such as silicon oxide. In some implementations, a planarization process, such as chemical mechanical polishing (CMP), can then be performed to polish a top surface of insulating layer 424.

Figure 4E:
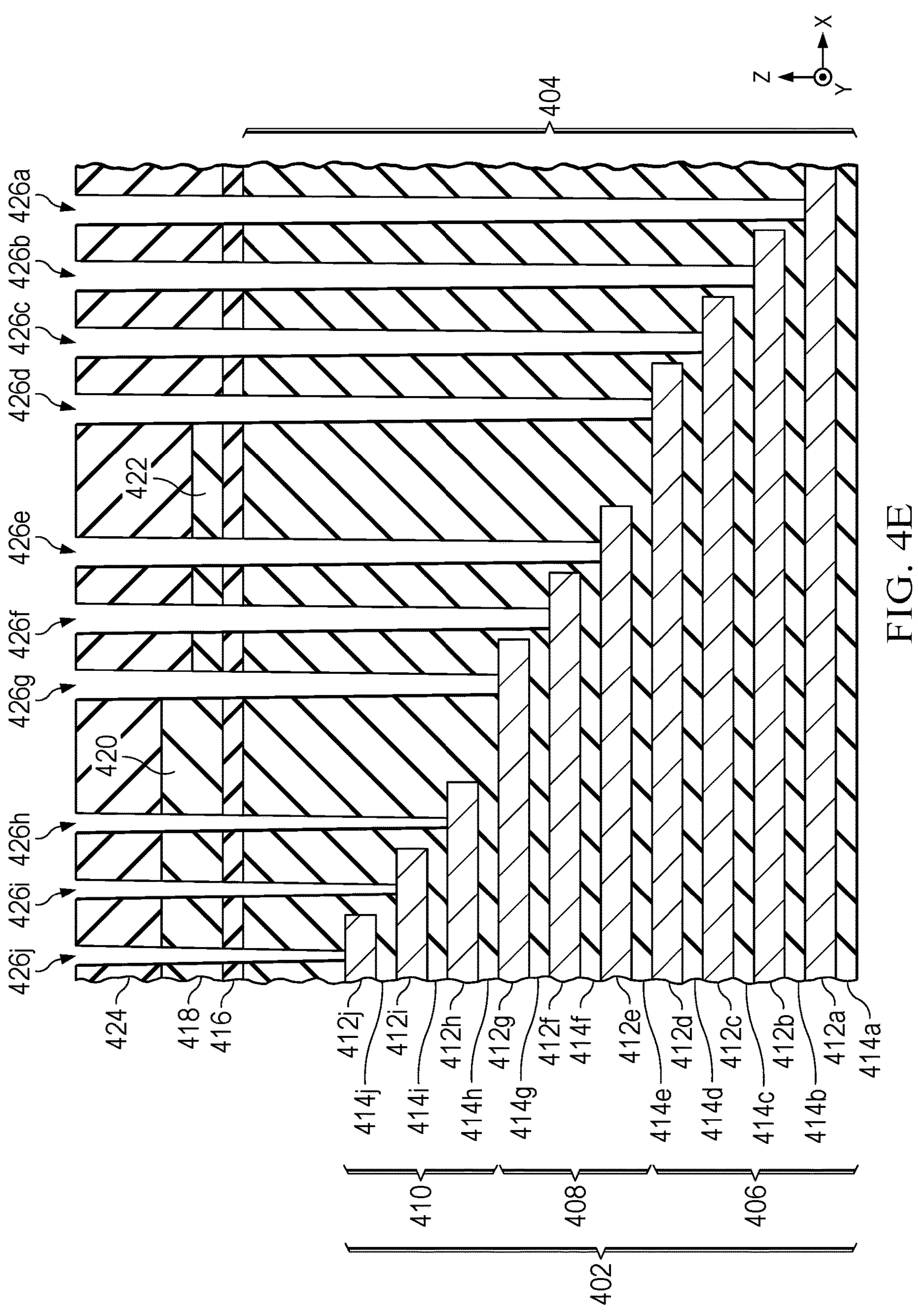

As shown in FIG. 4E, contact holes 426*a*-426*j* extending along the vertical direction are formed. Contact holes 426*a*-426*j* can be formed during one etching process. For example, a lithography process can be performed to pattern openings of contact holes 426*a*-426*j* on the top surface of insulating layer 424 using an etch mask (e.g., a photoresist mask and/or a hard mask), and a dry etching process (e.g., RIE) can be performed.

As the etching process proceeds, each of contact holes 426*a*-426*j* will start from the top surface of insulating layer 424, grow deeper and deeper, extend through insulating layers 424, 418, and 416 (or just insulating layers 424 and 416), and insulating structure 404, and extend into a corresponding conductive layer of conductive layers 412*a*-412*j*. Although some conductive layers are closer to the top surface of insulating layer 424 (along the vertical direction), insulating layer 418 can slow down the etching process of contact holes that will reach these conductive layers. Specifically, before a contact hole (e.g., contact hole 426*j*) extends into a conductive structure (e.g., conductive structure 412*j*) closer to the top surface of insulating layer 424, the contact hole has to extend through a thicker portion (e.g., portion 420) of insulating layer 418, which takes a longer time. Thus, contact holes 426*a*-426*j* may reach corresponding conductive layers within an appropriate time period so that no contact hole extends through the corresponding conductive layer after the etching process.

Figure 4F:
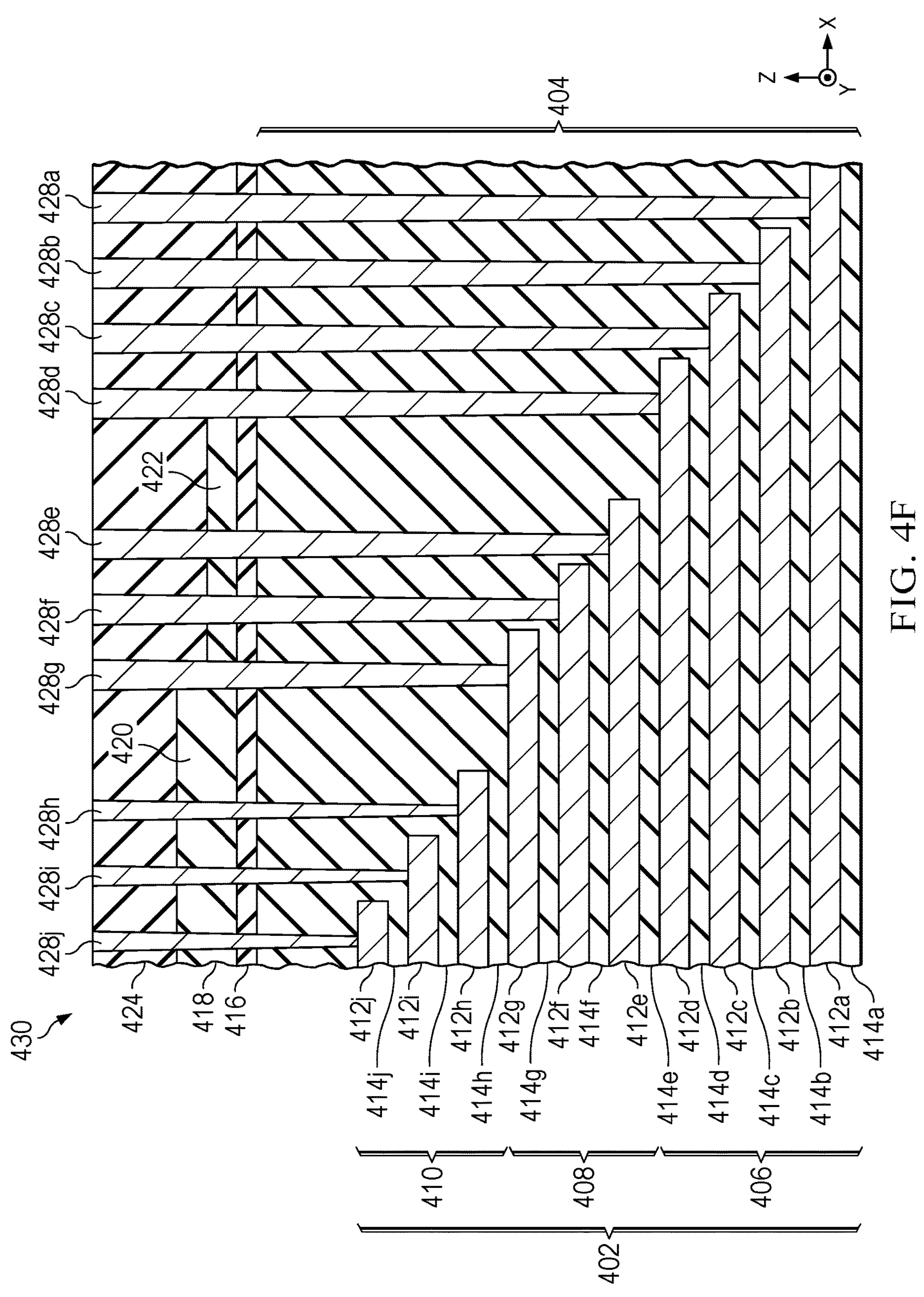

As shown in FIG. 4F, a semiconductor structure 430 including the stack 402, insulating structure 404, insulating layer 416, 418, and 424, and contact structures 428*a*-428*j* is formed. Contact structures 428*a*-428*j* can be formed by depositing a conductive material into each of contact holes 426*a*-426*j*. In some implementations, a bonding and/or insulating material can be deposited on an inner surface of each of contact holes 426*a*-426*j* before depositing the conductive material.

In some implementations, semiconductor structure 430 is a 3D memory device and has an array region. Semiconductor structure 430 can include at least one memory cell array formed by channel structures (e.g., channel structures 224 of FIG. 2A) and conductive layers 412*a*-412*j*. The channel structures can be formed by forming channel holes in the array region that extend through conductive layers 412*a*-412*j* and depositing a memory film in each of the channel holes.

FIG. 5 illustrates a flow chart of an example process 500 for forming a semiconductor structure, according to some aspects of the present disclosure. The semiconductor structure can be similar to, or same as, semiconductor structure 204 of FIG. 2A and semiconductor structure 200*b* of FIG. 2B, or a part of semiconductor structures 204 and 200*b*, or a structure at an intermediate fabrication process of semiconductor structures 204 and 200*b*. The process 500 can be described in view of FIGS. 4A-4F. The process 500 can include the fabrication process of forming the semiconductor structures in FIGS. 4A-4F. It is understood that the operations shown in process 500 are not exhaustive and that other operations can be performed as well before, after, or between any of the illustrated operations. Further, some of the operations may be performed simultaneously, or in a different order than shown in FIG. 5.

At operation 502, a semiconductor structure is provided. The semiconductor structure includes a stack (e.g., stack 402 of FIGS. 4A-4F) of conductive layers (e.g., conductive layers 412*a*-412*j* of FIGS. 4A-4F) and first insulating layers (insulating layers 414*a*-414*j* of FIGS. 4A-4F) extending along a first direction (e.g., the horizontal direction) and alternating with each other along a second direction (e.g., the vertical direction) perpendicular to the first direction. The conductive layers can extend by different lengths along the first direction and form a staircase structure of the stack (e.g., the staircase structure of stack 402). In some implementations, the semiconductor structure further includes an insulating structure (e.g., insulating structure 404 of FIG. 4A) in contact with the staircase structure of the stack. The insulating structure and the first insulating layers can include the same dielectric material including, but not limited to, silicon oxide, silicon nitride, silicon oxynitride, low dielectric constant (low-k) dielectrics, or any combination thereof. In some implementations, the insulating structure can be formed by filling or depositing the dielectric material over the stack.

At operation 504, a second insulating layer (e.g., insulating layer 418 of FIG. 4D) extending along the first direction is formed over the stack. The second insulating layer can include a first portion (e.g., portion 420 of FIG. 4D) and a second portion (e.g., portion 422 of FIG. 4D). A thickness of the first portion of the second insulating layer is greater than a thickness of the second portion of the second insulating layer along the second direction. A material of the second insulating layer has a first etching rate smaller than a material of the insulating structure. That is, the etching rate of the material of the second insulating layer is smaller than the material of the first insulating layers if the insulating structure and the first insulating layers include the same material. In some implementations, the second insulating layer can be formed by trimming and etching a portion of the second insulating layer into a stepped shape (e.g., as described with respect to FIG. 4C). In some implementations, the semiconductor structure includes an extra insulating layer (e.g., insulating layer 416 of FIG. 4C) between the second insulating layer and the insulating structure. The extra insulating layer can include a material having an etching rate smaller than an etching rate of the dielectric material of second insulating layer. As such, the extra insulating layer can prevent the insulating structure from being etched off during the trimming and etching processes of the second insulating layer. In some implementations, a third insulating layer (e.g., insulating layer 424 of FIG. 4D) can be deposited on top of the second insulating layer. The third insulating layer includes a material having a second etching rate greater than the material of the second insulating layer.

At operation 506, contact structures (e.g., contact structures 428*a*-428*j* of FIG. 4F) extending along the second direction are formed. The contact structures are connected to the staircase structure of the stack. Specifically, each of the contact structures is connected to a respective conductive layer of the conductive layers in the staircase structure of the stack. The contact structures include at least a first contact structure (e.g., contact structure 428*h* of FIG. 4F) and a second contact structure (e.g., contact structure 428*e* of FIG. 4F). A length of the first contact structure is smaller than a length of the second contact structure in the second direction. The first contact structure extends through the first portion of the second insulating layer, and the second contact structure extends through the second portion of the second insulating layer.

In some implementations, the contact structures are formed by forming contact holes (e.g., contact holes 426*a*-426*j* of FIG. 4E) extending along the second direction. A bonding material can be deposited on an inner surface of each of the contact holes. A conductive material can then be deposited into each of the contact holes.

In some implementations, the semiconductor structure is a 3D memory device (e.g., 3D NAND memory device 200*a* of FIG. 2A) that includes an array region. Process 500 can include forming channel holes in the array region of the semiconductor structure. The channel holes can extend through the conductive layers. Process 500 can further include depositing a memory film (e.g., memory film 226 of FIG. 2A) in each of the channel holes to form channel structures. The channel structures and the conductive layers can form at least one memory cell array of the 3D memory device.

Figure 6:
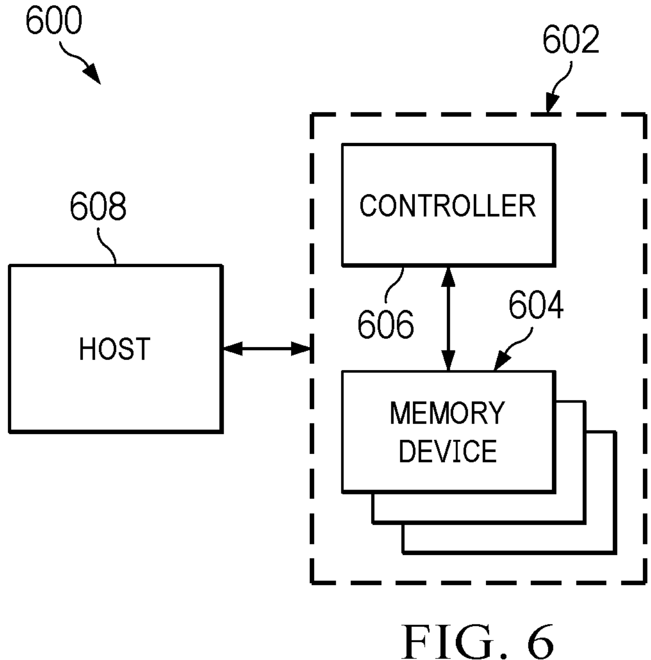
FIG. 6 illustrates a block diagram of an example system.

FIG. 6 illustrates a block diagram of a system 600 having one or more semiconductor devices (e.g., memory devices), according to one or more implementations of the present disclosure. The system 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, the system 600 can include a host device 608 and a memory system 602 having one or more memory devices 604 and a memory controller 606. Host device 608 can include a processor of an electronic device, such as a central processing unit (CPU), or a system-on-chip (SoC), such as an application processor (AP). Host device 608 can be configured to send or receive data to or from the one or more memory devices 604.

A memory device 604 can be any memory device disclosed herein, such as a memory device (e.g., a 3D memory device) based on the semiconductor structures of FIGS. 2A-2B, 3A-3B, and 4A-4F. In some implementations, a memory device 604 includes a NAND Flash memory. Memory controller 606 (a.k.a., a controller circuit) is coupled to memory device 604 and host device 608. Consistent with implementations of the present disclosure, memory device 604 can include a plurality of conductive interconnections through a cover layer that are in contact with conductive pads in a conductive pad layer, and memory controller 606 can be coupled to memory device 604 through at least one of the plurality of conductive interconnections. Memory controller 606 is configured to control memory device 604. For example, memory controller 606 may be configured to operate a plurality of channel structures via word lines. Memory controller 606 can manage data stored in memory device 604 and communicate with host device 608.

In some implementations, memory controller 606 is designed/configured for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed/configured for operating in a high duty cycle environment SSDs or embedded multi-media-cards (eMMCs) used as data storage for mobile devices, such as smartphones, tablets, laptop computers, etc., and enterprise storage arrays. Memory controller 606 can be configured to control operations of memory device 604, such as read, erase, and program (or write) operations. Memory controller 606 can also be configured to manage various functions with respect to the data stored or to be stored in memory device 604 including, but not limited to bad-block management, garbage collection, logical-to-physical address conversion, wear leveling, etc. In some implementations, memory controller 606 is further configured to process error correction codes (ECCs) with respect to the data read from or written to memory device 604. Any other suitable functions may be performed by memory controller 606 as well, for example, formatting memory device 604.

Memory controller 606 can communicate with an external device (e.g., host device 608) according to a particular communication protocol. For example, memory controller 606 may communicate with the external device through at least one of various interface protocols, such as a USB protocol, an MMC protocol, a peripheral component interconnection (PCI) protocol, a PCIexpress (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 606 and one or more memory devices 604 can be integrated into various types of storage devices, for example, be included in the same package, such as a universal Flash storage (UFS) package or an eMMC package. That is, memory system 602 can be implemented and packaged into different types of end electronic products. In one example as shown in FIG. 6, memory controller 606 and a single memory device 604 may be integrated into a memory card 602. Memory card 602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc.

Implementations of the subject matter and the actions and operations described in this present disclosure can be implemented in digital electronic circuitry, in tangibly-embodied computer software or firmware, in computer hardware, including the structures disclosed in this present disclosure and their structural equivalents, or in combinations of one or more of them. Implementations of the subject matter described in this present disclosure can be implemented as one or more computer programs, e.g., one or more modules of computer program instructions, encoded on a computer program carrier, for execution by, or to control the operation of, data processing apparatus. The carrier may be a tangible non-transitory computer storage medium. Alternatively, or in addition, the carrier may be an artificially-generated propagated signal, e.g., a machine-generated electrical, optical, or electromagnetic signal, that is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

It is noted that references in the present disclosure to "one embodiment," "an embodiment," "an example embodiment," "some implementations," "some implementations," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other implementations whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically noN+ conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. As used herein, the range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., .+−. 10%, .+−. 20%, or .+−. 30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

The present disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include implementations in which the first and second features may be in direct contact, and may also include implementations in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various implementations and/or configurations discussed.

The foregoing description of the specific implementations can be readily modified and/or adapted for various applications. Therefore, such adaptations and modifications are intended to be within the meaning and range of equivalents of the disclosed implementations, based on the teaching and guidance presented herein.

While the present disclosure contains many specific implementation details, these should not be construed as limitations on the scope of what is being claimed, which is defined by the claims themselves, but rather as descriptions of features that may be specific to particular implementations of particular inventions. Certain features that are described in this present disclosure in the context of separate implementations can also be implemented in combination in a single embodiment. Conversely, various features that are described in the context of a single embodiment can also be implemented in multiple implementations separately or in any suitable sub-combination. Moreover, although features may be described above as acting in certain combinations and even initially be claimed as such, one or more features from a claimed combination can in some cases be excised from the combination, and the claim may be directed to a sub-combination or variation of a sub-combination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations also are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The breadth and scope of the present disclosure should not be limited by any of the above-described exemplary implementations, but should be defined only in accordance with the following claims and their equivalents.

What is claimed is:

1. A semiconductor device, comprising:

conductive layers comprising a first conductive layer and a second conductive layer;

an insulating structure extending along a first direction over the first conductive layer and the second conductive layer, wherein the insulating structure comprises a first layer extending along the first direction, and a material of the first layer has a first etching rate smaller than an etching rate of an insulating material between the conductive layers;

a first contact structure extending through a first portion of the first layer and connected to the first conductive layer; and a second contact structure extending through a second portion of the first layer and connected to the second conductive layer, wherein the first contact structure and the second contact structure extend along a second direction perpendicular to the first direction, a length of the first contact structure is smaller than a length of the second contact structure in the second direction, wherein a thickness of the first portion of the first layer is different from a thickness of the second portion of the first layer along the second direction.

2. The semiconductor device of claim 1, wherein the thickness of the first portion of the first layer is greater than the thickness of the second portion of the first layer.

3. The semiconductor device of claim 2, wherein the insulating structure comprises a second layer comprising the insulating material, and the first contact structure and the second contact structure extend through the first layer and the second layer.

4. The semiconductor device of claim 3, further comprising:

a third conductive layer over the first conductive layer and the second conductive layer; and a third contact structure extending through the second layer and connected to the third conductive layer, wherein a length of the third contact structure is greater than the length of the second contact structure.

5. The semiconductor device of claim 2, wherein the semiconductor device comprises a first deck and a second deck stacked along the second direction, the first deck comprises the first conductive layer, and the second deck comprises the second conductive layer.

6. The semiconductor device of claim 5, wherein the semiconductor device comprises a third contact structure connected to a third conductive layer comprised in the first deck, and wherein a length of the third contact structure is different from the length of the first contact structure, and the first contact structure and the third contact structure extend through the first portion of the first layer.

7. The semiconductor device of claim 2, wherein the insulating structure comprises a third layer extending along the first direction, the third layer is between the first layer and the first conductive layer, and a material of the third layer has a second etching rate smaller than the material of the first layer.

8. The semiconductor device of claim 1, wherein each of the first conductive layer and the second conductive layer has an edge portion thinner than an inner portion along the second direction.

9. The semiconductor device of claim 1, wherein the first contact structure has a different cross section area than the second contact structure at a same position along the second direction.

10. The semiconductor device of claim 1, wherein the semiconductor device comprises a three-dimensional (3D) NAND memory device comprising an array wafer, and the array wafer comprises an array region and a connection region, wherein the semiconductor device comprises multiple conductive layers extending through both the array region and the connection region, the multiple conductive layers comprise the first conductive layer and the second conductive layer, and the first contact structure and the second contact structure extend through the connection region, and wherein the array region comprises channel structures, the channel structures and the multiple conductive layers form at least one memory cell array of the 3D NAND memory device.

11. The semiconductor device of claim 10, wherein the semiconductor device comprises a complementary metal-oxide-semiconductor (CMOS) wafer, the CMOS wafer comprises peripheral circuits of the at least one memory cell array, and the array wafer and the CMOS wafer are bonded together through a bonding interface.

12. The semiconductor device of claim 1, wherein the semiconductor device comprises a three-dimensional (3D) dynamic random-access memory (DRAM), and wherein the first conductive layer and the second conductive layer comprise word lines of the 3D DRAM or bit lines of the 3D DRAM.

13. A dynamic random-access memory (DRAM), comprising:

an array of DRAM memory cells;

conductive layers comprising a first conductive layer and a second conductive layer coupled to the array of DRAM memory cells;

an insulating structure extending along a first direction over the first conductive layer and the second conductive layer, wherein the insulating structure comprises a first layer extending along the first direction, and a material of the first layer has a first etching rate smaller than an insulating material between the conductive layers;

a first contact structure extending through a first portion of the first layer and connected to the first conductive layer; and a second contact structure extending through a second portion of the first layer and connected to the second conductive layer, wherein the first contact structure and the second contact structure extend along a second direction perpendicular to the first direction, a length of the first contact structure is greater than a length of the second contact structure in the second direction, a thickness of the first portion of the first layer is different from a thickness of the second portion of the first layer along the second direction, the first conductive layer is connected to at least a first semiconductor pillar extending along a third direction perpendicular to the first direction and the second direction, and the second conductive layer is connected to at least a second semiconductor pillar extending along the third direction.

14. The DRAM of claim 13, wherein the first conductive layer and the second conductive layer are word lines of the DRAM.

15. The DRAM of claim 13, wherein the first conductive layer and the second conductive layer are bit lines of the DRAM.

16. A method of fabricating a semiconductor device, comprising:

providing a semiconductor structure comprising a stack of conductive layers and first insulating layers extending along a first direction and alternating with each other along a second direction perpendicular to the first direction, wherein the conductive layers extend by different lengths along the first direction and form a staircase structure of the stack;

forming a second insulating layer extending along the first direction over the stack, wherein the second insulating layer comprises a first portion and a second portion, a thickness of the first portion of the second insulating layer is greater than a thickness of the second portion of the second insulating layer along the second direction, and a material of the second insulating layer has a first etching rate smaller than a material of the first insulating layers; and forming contact structures extending along the second direction and being connected to the staircase structure of the stack, wherein the contact structures comprise at least a first contact structure and a second contact structure, a length of the first contact structure is smaller than a length of the second contact structure in the second direction, the first contact structure extends through the first portion of the second insulating layer, and the second contact structure extends through the second portion of the second insulating layer.

17. The method of claim 16, wherein forming the contact structures comprises forming contact holes extending along the second direction.

18. The method of claim 17, wherein forming the contact structures further comprises:

depositing a bonding material on an inner surface of each of the contact holes; and depositing a conductive material into each of the contact holes.

19. The method of claim 16, wherein forming a second insulating layer comprises:

trimming and etching a portion of the second insulating layer into a stepped shape.

20. The method of claim 17, further comprising:

depositing a third insulating layer on top of the second insulating layer, wherein the third insulating layer includes a material having a second etching rate greater than the material of the second insulating layer, wherein the contact holes extend through the third insulating layer.

* * * * *